United States Patent [19]

Lowther

[11] Patent Number: 4,463,214

[45] Date of Patent: Jul. 31, 1984

[54] THERMOELECTRIC GENERATOR APPARATUS AND OPERATION METHOD

[75] Inventor: Frank E. Lowther, Chatsworth, Calif.

[73] Assignee: Atlantic Richfield Company, Los Angeles, Calif.

[21] Appl. No.: 358,738

[22] Filed: Mar. 16, 1982

[51] Int. Cl.³ .......................................... H01L 35/28
[52] U.S. Cl. .................................... 136/208; 136/201; 136/205; 136/206; 136/209; 136/211; 136/212; 136/224; 136/227
[58] Field of Search ............... 136/201, 205, 206, 208, 136/209, 210, 211, 212, 224, 227

[56] References Cited

U.S. PATENT DOCUMENTS

| | | | |
|---|---|---|---|
| 375,408 | 12/1887 | Acheson . | |
| 407,762 | 7/1889 | Acheson . | |
| 941,826 | 11/1909 | Taylor | 136/201 |
| 1,118,269 | 11/1914 | Creveling . | |
| 1,134,452 | 4/1915 | Hale . | |
| 2,015,610 | 9/1935 | Underwood | 136/4 |
| 2,362,259 | 11/1944 | Findley | 171/125 |
| 2,391,994 | 1/1946 | McCollum | 244/134 |
| 2,959,925 | 11/1960 | Frantti et al. | 136/208 X |
| 3,004,393 | 10/1961 | Alsing | 136/208 X |
| 3,048,643 | 8/1962 | Winckler et al. | 136/4 |
| 3,090,875 | 5/1963 | Harkness | 310/4 |
| 3,138,486 | 6/1964 | Hill et al. | 136/5 |
| 3,198,969 | 8/1965 | Kolm et al. | 310/4 |
| 3,279,954 | 10/1966 | Cody et al. | 136/205 |
| 3,297,492 | 1/1967 | Pepper | 136/208 |
| 3,349,248 | 10/1967 | Garnier | 290/2 |
| 3,356,539 | 12/1967 | Stachurski | 136/205 |
| 3,358,162 | 12/1967 | Krake et al. | 310/4 |
| 3,421,944 | 1/1969 | Bauer | 136/6 |
| 3,547,705 | 12/1970 | Heard, Jr. | 136/203 |
| 3,564,860 | 2/1971 | Reich et al. | 62/3 |
| 3,666,566 | 5/1972 | Paine | 136/202 |
| 3,719,532 | 3/1973 | Falkenberg et al. | 136/208 |
| 3,783,031 | 1/1974 | Chad | 136/237 |
| 3,873,370 | 3/1975 | Hampl, Jr. et al. | 136/205 |
| 3,899,359 | 8/1975 | Stachurski | 136/205 |
| 4,039,352 | 8/1977 | Marinescu | 136/205 |
| 4,095,998 | 6/1978 | Hanson | 136/208 |
| 4,125,122 | 11/1978 | Stachurski | 136/205 |
| 4,211,828 | 7/1980 | Peck | 429/11 |
| 4,218,266 | 8/1980 | Guazzoni et al. | 136/209 |
| 4,320,344 | 3/1982 | Nicholas | 374/45 X |

OTHER PUBLICATIONS

Paul E. Gray, *The Dynamic Behavior of Thermoelectric Devices*, The Technology Press of The Massachusetts Institute of Technology and John Wiley & Sons, Inc., New York, London, 1960.

Richard Lewis Field, *A Study of the Fast Transient Behavior of Pulsed Thermoelectric Coolers*, University Microfilms, Ann Arbor, Michigan, 1971.

*Primary Examiner*—Leland A. Sebastian
*Attorney, Agent, or Firm*—Nilsson, Robbins, Dalgarn, Berliner, Carson & Wurst

[57] ABSTRACT

A method of operating a thermoelectric generator includes: cyclically producing increasing then decreasing temperature differences in the thermoelectric material of the generator; and generating a cyclically increasing then decreasing electrical generator output signal, in response to such temperature differences, to transmit electrical power generated by the generator from the generator. Part of the thermoelectric material reaches temperatures substantially above the melting temperature of the material. The thermoelectric material of the generator forms a part of a closed electrical loop about a transformer core so that the inductor voltage for the loop serves as the output signal of the generator. A thermoelectric generator, which can be driven by the described method of operation, incorporates fins into a thermopile to conduct heat toward or away from the alternating spaces between adjacent layers of different types of thermoelectric material. The fins extend from between adjacent layers, so that they can also conduct electrical current between such layers, perpendicularly to the direction of stacking of the layers. The exhaust from an internal combustion engine can be employed to drive the thermoelectric generator, and, also, to act as a driver for a thermoelectric generator in accordance with the method of operation initially described.

25 Claims, 23 Drawing Figures

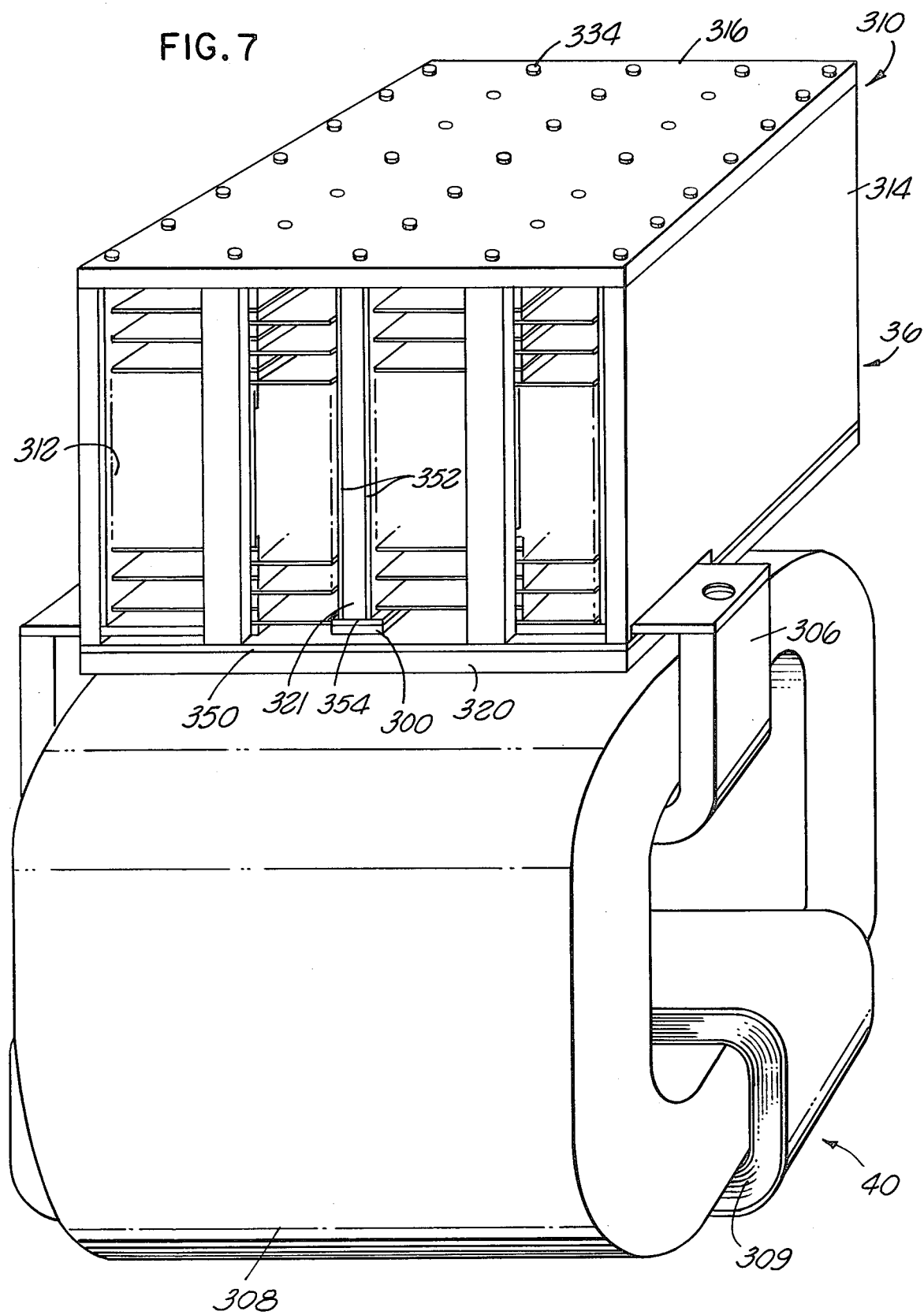

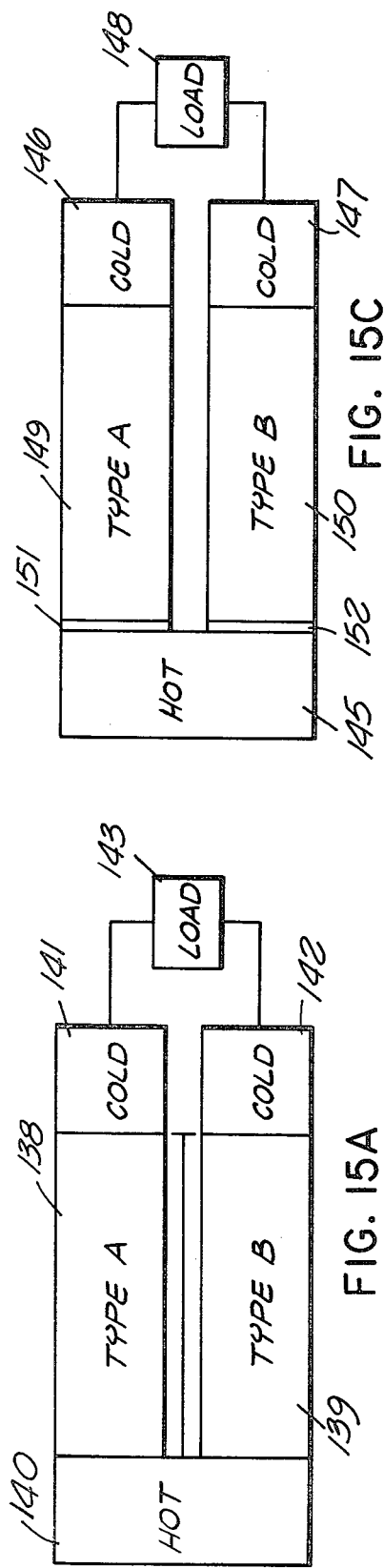
FIG. 15C
FIG. 15A
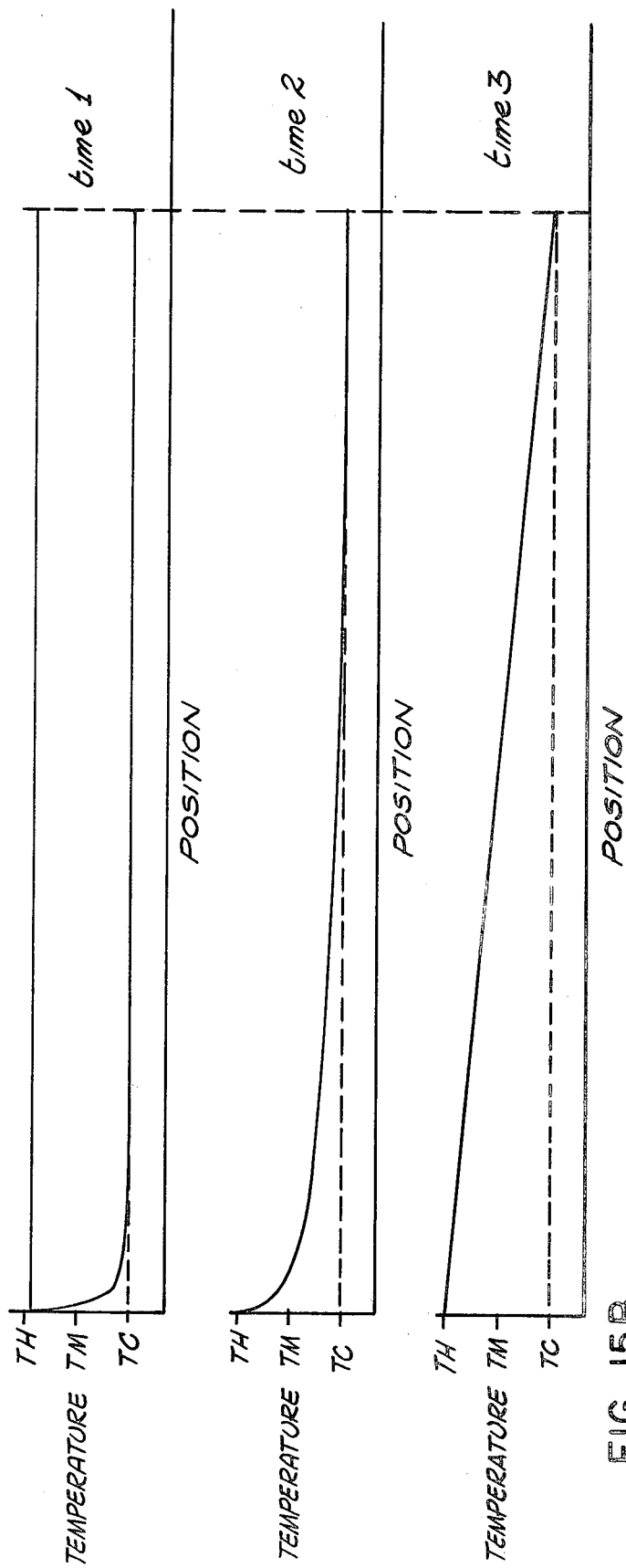
FIG. 15B

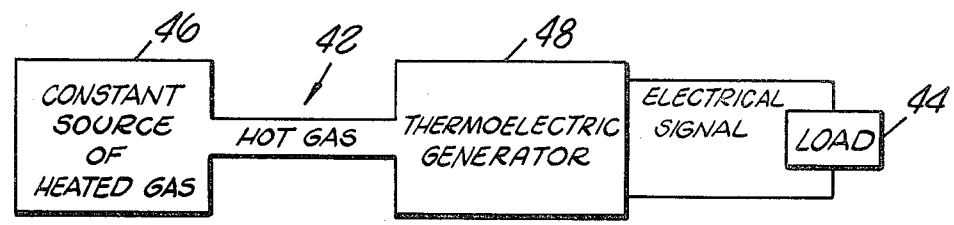
FIG. 16
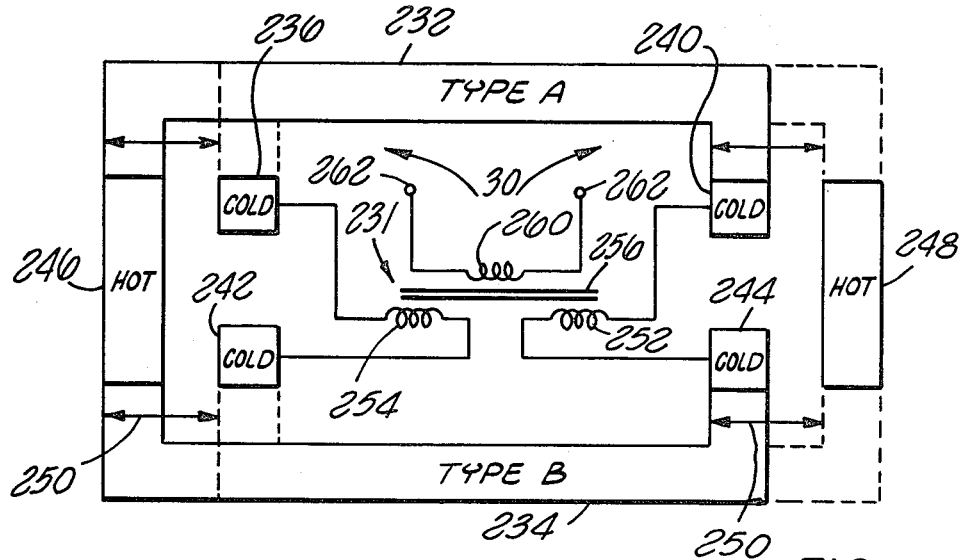
FIG. 17
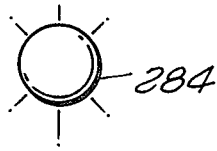
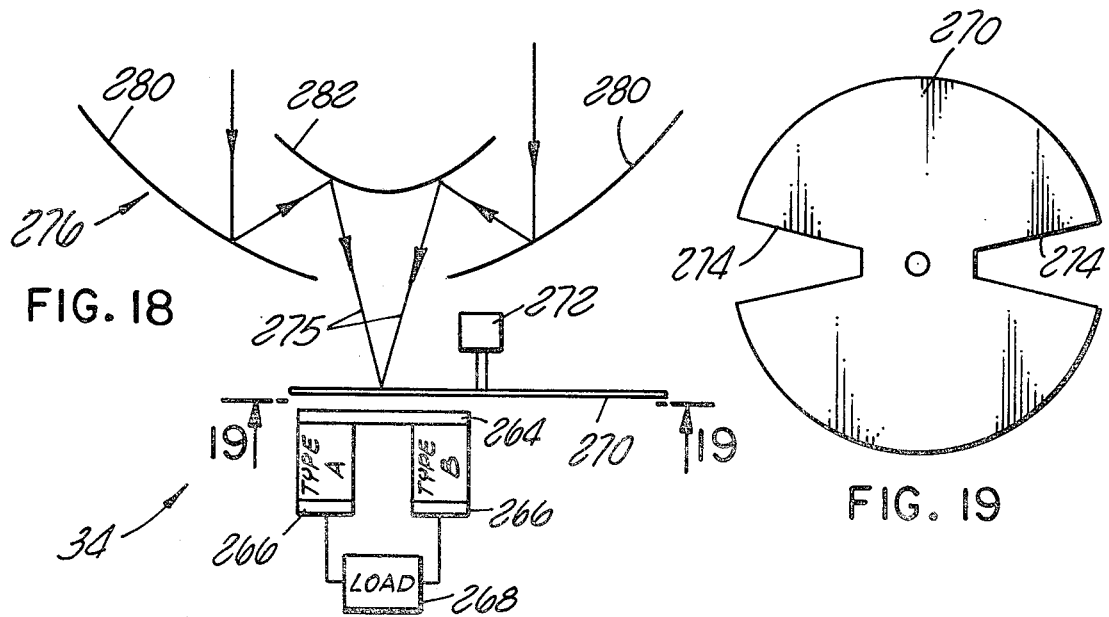
FIG. 18
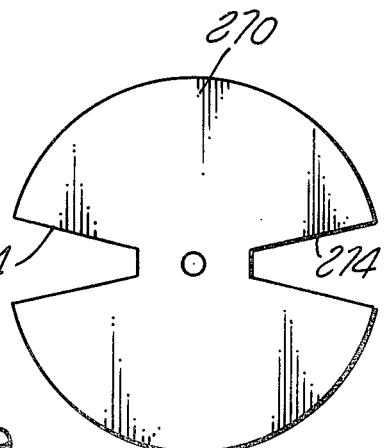
FIG. 19

THERMOELECTRIC GENERATOR APPARATUS AND OPERATION METHOD

BACKGROUND OF THE INVENTION

The field of the invention pertains to thermoelectric generators and methods of operating such generators.

Thermoelectric materials, and generators grounded in the use of such materials, have engendered a great deal of interest over many years. Such materials generate electrical power in response to temperature differences therealong. In particular, a piece of thermoelectric material will generate a voltage (the Seebeck voltage) between two points therealong dependent upon the temperature difference between such points.

In light of this, the widespread interest in thermoelectric generators is readily understandable. Heat, to create the required temperature differences, is readily available in a variety of forms. Electrical power, which can be generated by thermoelectric generators from such heat, is highly valued.

Typically, to generate a thermoelectric voltage across a piece of thermoelectric material, a steady state, generally linear, temperature profile is established along the piece of material to provide a steady state voltage.

Due to efficiencies which have been considered unacceptably low for all but specialized applications, substantial efforts have been made to improve the performance of thermoelectric generators. Most of these efforts can be classified into four categories: (1) efforts to permit higher temperatures (and thus temperature differences) in the thermoelectric material, largely through a search for better materials; (2) efforts toward the utilization of readily available heat sources, toward the improvement of the characteristics and efficiencies of heat sources and toward convenient ways of taking and using the electrical power from the generators; (3) efforts directed to the detailed structures of, or intimately associated with, the thermoelectric material elements of the generators; and (4) efforts toward the efficient use, recovery and reuse of heat which is required by the generators.

Concerning the first of these categories, the classical goal is to find or develop materials having a high Figure of Merit. This Figure of Merit is, in general, taken to be a measure of the capability of a thermoelectric material to efficiently convert temperature differences to electrical power. The Figure of Merit (Z) is a function of the Seebeck Coefficient (S), the electrical conductivity ($\sigma$) and the thermal conductivity (k) of the material, as follows:

$$Z=S^2(\sigma/k),$$

where

S is in units of volts/(degree C),
$\sigma$ is in units of mho/(cm), and
k is in units of cal/(sec-cm-degree C).

This search is generally accompanied by a search for materials which, at the same time, can tolerate higher temperatures (and thus higher temperature differences) to, in effect, be converted to electrical power.

Chad, U.S. Pat. No. 3,783,031, Hill et al., U.S. Pat. No. 3,138,486, Cody et al., U.S. Pat. No. 3,279,954 and Hampl, Jr. et al., U.S. Pat. No. 3,873,370, are typical and illustrative of the concern and efforts directed to this first category. In particular, Chad indicates the existence of the problem of evaporation of dopants and of base materials in thermoelectric cells operating at elevated temperatures. Hill indicates the desire for higher temperature thermoelectric materials—in the case of Hill, in the range of from about 800 degrees centigrade to 1500 degrees centigrade. Cody similarly indicates the desire for higher temperature materials—in Cody, in the range of about 1200 degrees kelvin. Hampl is along similar lines in showing the desirability of higher temperature operation capabilities—in Hampl, in the range of about 1000 degrees centigrade.

The second of the above categories pertains to the form or characteristics of the heat source which provides heat to the thermoelectric generator or of the removal and utilization of the electrical power provided by the generator. With respect to this category, Findley, U.S. Pat. No. 2,362,259, Underwood, U.S. Pat. No. 2,015,610, Creveling, U.S. Pat. No. 1,118,269, Hale, U.S. Pat. No. 1,134,452, Pepper, U.S. Pat. No. 3,297,492, Hanson, U.S. Pat. No. 4,095,998, McCollum, U.S. Pat. No. 2,391,994, and Harkness, U.S. Pat. No. 3,090,875, are typical and illustrative.

Findley incorporates a pulsed pump to provide pulses of fuel when the back pressure in the fuel line is low. This is viewed as a convenient way of providing fuel to a combustion chamber. In addition, current from an array of thermoelectric cells is employed to open and close a magnetic (solenoid-type) relay.

Underwood monitors the voltage of a thermoelectric generator to open and close (through use of a solenoid) the supply of fuel, in order to maintain the voltage in a desired range. This approach is adapted to maintain the voltage substantially constant and, also, to be adjusted so that the fuel supply is not rapidly cut-off, opened, cut-off, etc.

In Creveling, a thermoelectric generator is driven by an internal combustion engine (i.e., a combustion engine employing reciprocating cylinders in the generation of power). Current from the generator is used in a solenoid-type relay (and to charge a battery and power other devices). In McCollum, the internal resistance of a thermoelectric generator is used to heat and, thereby, de-ice airplane wings. High resistance metals in the wings, as a load on the generator, are similarly employed.

In Harkness, current from a thermoelectric generator (to which heat is provided from a burner) is passed through the rotor of a motor to provide the current through the rotor which results in the rotation of the rotor. The rotor is a disc or a disc with internal spokes. The motor in Harkness uses permanent magnets, or electromagnets which, it is noted, could be driven by a thermoelectric generator. Hale and Pepper are of interest in providing an internal combustion engine as a source of heat for a thermoelectric generator. Hanson, similarly, employs a vehicle engine.

Still with regard to this second category, Kolm et al., U.S. Pat. No. 3,198,969, Bauer, U.S. Pat. No. 3,421,944 and Peck, U.S. Pat. No. 4,211,828 are of some, peripheral interest.

Kolm is directed to the utilization of pyroelectric, including piezoelectric, effects in materials such as ceramics to develop pyroelectric energy. Expansion of the material, with heating, and contraction of the material, with cooling, such expansion or contraction being toward or away from a heat sink which contributes to such cooling, is employed. Such heating and cooling also provides the pyroelectric energy. In one form, cylindrically arranged pieces of pyroelectric material rotate toward and away from a heat source, such as the sun. The energy is removed from the material by a commutator arrangement. In another form, a cylindrical configuration of pyroelectric material is disposed about a rod which is heated by a hot gas source. As a result, the material expands away from the shaft toward a heat sink and, due to the approaching of the heat sink, subsequently contracts back toward the shaft. Switches and associated circuitry can be used to remove the pyroelectric energy from the material.

Bauer is directed to a pulse battery having structure designed with a view to limiting negative factors, such as resistive loss.

Peck is directed to the reduction or elimination of the conventionally decreasing output over time in conventional thermoelectric cells using an electrolyte for conduction between the electrodes.

The third area in which much of the effort toward improving the performance of thermoelectric generators has been made, concerns the detailed structures of, or associated with, the thermoelectric material elements in such generators. Stachurski, U.S. Pat. No. 3,356,539, Stachurski, U.S. Pat. No. 3,899,359, Underwood, U.S. Pat. No. 2,015,610, Falkenberg et al., U.S. Pat. No. 3,719,532, Hale, U.S. Pat. No. 1,134,452, Pepper, U.S. Pat. No. 3,297,492, Winckler et al., U.S. Pat. No. 3,048,643, Krake et al., U.S. Pat. No. 3,358,162, and Hampl, Jr., U.S. Pat. No. 3,873,370, are typical and illustrative of efforts in this area.

In Stachurski, U.S. Pat. No. 3,356,539, a sandwich of thin thermoelectric material structure and thin conducting plates is used in segments along a leg of one type of material, in providing a desired temperature gradient along the leg.

Stachurski, U.S. Pat. No. 3,899,359 incorporates thermoelectric material in sandwiches between contacts, such sandwiches being used in forming segments of a leg of material of one type, in order to provide a temperature gradient along the leg. Somewhat unconventional thin structures are also employed.

Underwood is directed to deriving the advantages of relatively short thermoelectric material elements. Heat conducting structure is also provided which is generally disposed parallel to face-to-face ends of thermoelectric material elements of different materials. Such thermoelectric material elements are bent into three segments, including such end segments.

Falkenberg provides generally conventional heat conduction vanes with generally conventional series connections of thermoelectric material elements.

Hale provides a sandwich of alternating thermoelectric materials, largely insulated by insulation materials therebetween. The ends of the thermoelectric material elements have holes for the passage of heat conduction fluid therethrough.

Pepper is directed to a substantially conventional thermoelectric material arrangement. The cold contacts of the arrangement have relatively large fins therealong.

Winckler, apparently, provides a piece of P-type material, specially configured N-type material, and a contact which also may be specially configured, in, essentially, a three-piece sandwich in which the P- and N-type materials are next to one another. The special configuration for the N-type material is to provide reduced thermal conductance.

In Krake, two different porous, electron-emitting materials are provided in a four-piece sandwich between electrodes which are at different temperatures. A thin metal layer can be provided between the materials, to prevent diffusion between the materials. In a different embodiment, a single sensitive material version, it is indicated that at low temperatures, classical thermoelectric power generation is provided, but at higher temperatures, conduction takes place through the electron gas resulting from the emission of electrons.

Hampl is directed to a thermoelectric material element incorporating migrating atoms, which is divided into segments with barriers between the segments. The separate segments, as indicated, are part of a one-material leg.

Kolm, U.S. Pat. No. 3,198,969, as described above, Marinescu, U.S. Pat. No. 4,039,352, Heard, Jr., U.S. Pat. No. 3,547,705, and Reich et al., U.S. Pat. No. 3,564,860, are of some, peripheral interest with regard to this area.

Marinescu provides a closely-bonded and closely-packed series arrangement to generate electrical power, wherein such power generation is predicated on the difference in work function between metals disposed on either side of a semiconductor. Operation is grounded in the uniform heating and temperature of the power-generating elements.

Heard addresses the undesirability of joints from the perspective of wasted energy in a thermoelectric unit. Structure therein is directed to reducing or avoiding such waste by using crystal growth to provide such joints. The structure is particularly adapted for Peltier—i.e., thermoelectric heating and cooling—units.

Reich is also particularly adapted for Peltier unit applications in providing thermoelectric material legs having changing thermoelectric properties therealong. Peltier units incorporating such legs are arranged as cascade stages of a multi-unit system.

The fourth category in which many efforts to improve the performance of thermoelectric generators falls, relates to the efficient use, recovery and reuse of the heat required to drive thermoelectric generators, particularly with reference to heat-carrying fluids, such as combustion gases. Typical and illustrative references of interest to those who focus on this area are: Stachurski, U.S. Pat. No. 4,125,122, Stachurski, U.S. Pat. No. 3,356,539, Stachurski, U.S. Pat. No. 3,899,359, Guazzoni et al., U.S. Pat. No. 4,218,266, Underwood, U.S. Pat. No. 2,015,610, Falkenberg et al., U.S. Pat. No. 3,719,532, Garnier, U.S. Pat. No. 3,349,248 (thermionic power generation), and Payne, U.S. Pat. No. 3,666,566. A number of these, of course, have been noted above in other contexts to which they also pertain.

Other references, as follows, are considered to be of some, limited relevance to the subject matter herein: Acheson, U.S. Pat. Nos. 375,408 and 407,762, Krebs, U.S. Pat. No. 3,859,143, Kim, U.S. Pat. No. 3,794,527, Rittmayer et al., U.S. Pat. No. 3,900,603, and Bressler, U.S. Pat. No. 3,508,974.

Despite the evident effort directed to improving thermoelectric generators, in the past, as indicated, such generators have not been considered satisfactory for general applications, but only for specific and narrow uses.

The present subject matter is directed to the second and third of the above categories of effort relating to thermoelectric generators. Thus, it is, first of all, directed to the manner in which thermoelectric generators are operated and the manner in which the electrical power they generate is taken from the generator and utilized—including the interaction between the generator and its heat source and the interaction between the generator and the apparatus directed to the recovery and use of the electrical power generated. It, secondly, is directed to the detailed structures of, and intimately associated with, the thermoelectric material elements in thermoelectric generators. It also, within the context of the second and third categories, pertains to the first and third categories, in particular to thermoelectric material choices and to efficient use, recovery and reuse of the heat required by thermoelectric generators. Moreover, it is directed to these matters in an integrated, comprehensive fashion.

SUMMARY OF THE INVENTION

In accordance with method aspects of the invention, a method of operating a thermoelectric generator for generating electrical power in response to heat, includes the steps of: cyclically producing increasing then decreasing temperature differences in the thermoelectric material of the generator; and generating a cyclically increasing then decreasing electrical generator output signal, in response to such temperature differences, to transmit electrical power generated by the generator from the generator.

The temperature of part of the thermoelectric material may be cyclically increased to at least the melting temperature of the material multiplied by 1.5, substantially without melting such material. To cyclically produce the increasing then decreasing temperature differences, heat may be cyclically provided to the thermoelectric material of the generator, e.g., by an internal combustion engine. In addition, the generator output signal may include the inductor voltage for a loop about a magnetic core; and the current through the loop may pass through the thermoelectric material of the generator.

In accordance with other, apparatus aspects of the invention, a thermoelectric generator for generating electrical power in response to heat, includes: a thermopile to receive the heat and generate electrical power in response to the heat; and electrical connector means for transmitting such generated electrical power away from the thermopile. The thermopile includes a plurality of layers of thermoelectric material of a first type and a plurality of layers of thermoelectric material of a second type. The layers of the two types have alternating thermoelectric material layer positions in the thermopile; and each of such layers of each type and the next such layer of the other type are electrically connected across at least approximately the majority of the area between the two layers.

The thermopile, in addition, may include a plurality of heat conduction fins, each extending, from the vicinity of the layers of thermoelectric material, substantially perpendicularly to the direction of stacking of such layers. The plurality of fins, further, may have two alternating fin configurations in the thermopile. In one configuration, for receiving heat away from the layers of the thermopile and conducting such heat toward such layers, the described extending of the fin is to one side of the layers of the thermopile. In the other configuration, for receiving heat from the layers of the thermopile and conducting such heat away from such layers, the described extending of the fin is to the other side of the layers. Further, with reference to the plurality of fins having the two configurations, each of such fins, in addition to its above-described extending from the vicinity of the layers of thermoelectric material of the thermopile, may extend between two of the thermoelectric material layers of the two types which are in alternating thermoelectric material layer positions, to conduct electrical current between the two layers.

In accordance with other, related apparatus aspects of the invention, a thermoelectric generator for generating electrical power in response to heat again includes: a thermopile to receive the heat and generate electrical power in response to the heat; and electrical connector means for transmitting such generated electrical power away from the thermopile. Again, the thermopile includes a plurality of layers of thermoelectric material of a first type and a plurality of layers of thermoelectric material of a second type wherein such layers of the two types have alternating thermoelectric material layer positions in the thermopile. Further, in accordance with these other aspects of the invention, each of the layers of each type and the next layer of the other type are electrically connected to provide, with the plurality of layers of the two types, a substantially linear electrical path through and between the plurality of layers. Such path may be a substantially straight, linear electrical path. Fin related features, generally along the lines described with reference to the prior apparatus aspects of the invention, may also be provided.

In accordance with other, output-related apparatus aspects of the invention, a thermoelectric generator system includes: a thermopile for generating electrical current through such thermopile in response to heat; a magnetic core; and electrical connector means electrically connected to the thermopile for forming a closed electrical path of a single loop only through the thermopile about the core for such electrical current. The magnetic core may include a transformer core, wherein the loop is the loop of a single loop primary, input inductor for the core and wherein a secondary, output inductor for the core is provided about the core.

In accordance with yet other, output-related aspects of the invention, a thermoelectric generator system includes: a thermopile for generating electrical current through the thermopile in response to heat; a transformer core having a secondary, output inductor about such core; and electrical connector means electrically connected to the thermopile for forming a closed electrical path for such current, the path including at least one loop of a primary, input inductor about the core.

BRIEF DESCRIPTION OF THE DRAWINGS

FIG. 7 is a perspective view of a thermoelectric generator and associated output apparatus in accordance with apparatus aspects of the invention.

FIG. 15A is a somewhat schematic view showing a thermoelectric cell provided with a load; FIG. 15B shows a qualitatively illustrative temperature profile, at three points in time, along a leg of the thermoelectric cell of FIG. 15A; and FIG. 15C is a somewhat schematic view showing a variation of the thermoelectric cell of FIG. 15A provided with a load.

FIG. 16 is a block diagram showing a thermoelectric generator being operated in accordance with prior art methods.

FIG. 17 is a substantially schematic view showing a thermoelectric cell being operated in accordance with method aspects of the invention.

FIG. 18 is another substantially schematic view showing a thermoelectric cell being operated in accordance with method aspects of the invention.

FIG. 19 is a sectional view taken along the line 19—19 of FIG. 18.

DETAILED DESCRIPTION

Figure 1:
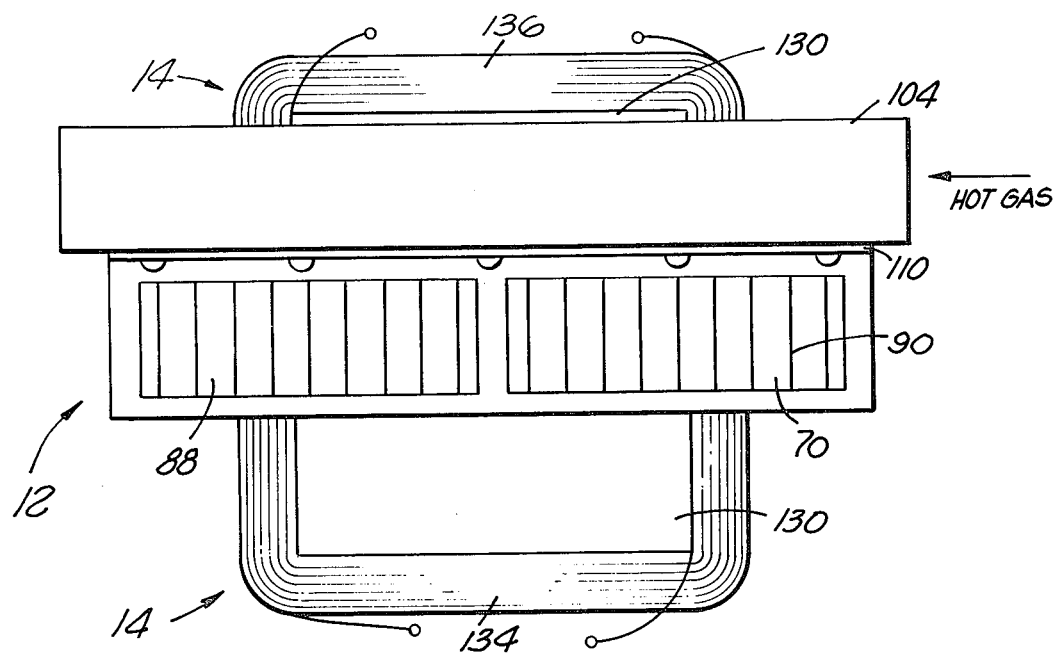
FIG. 1 is a plan view of a thermoelectric generator adapted for operation in accordance with the method aspects of the invention which is provided with output apparatus in accordance with apparatus aspects of the invention.
Figure 2:
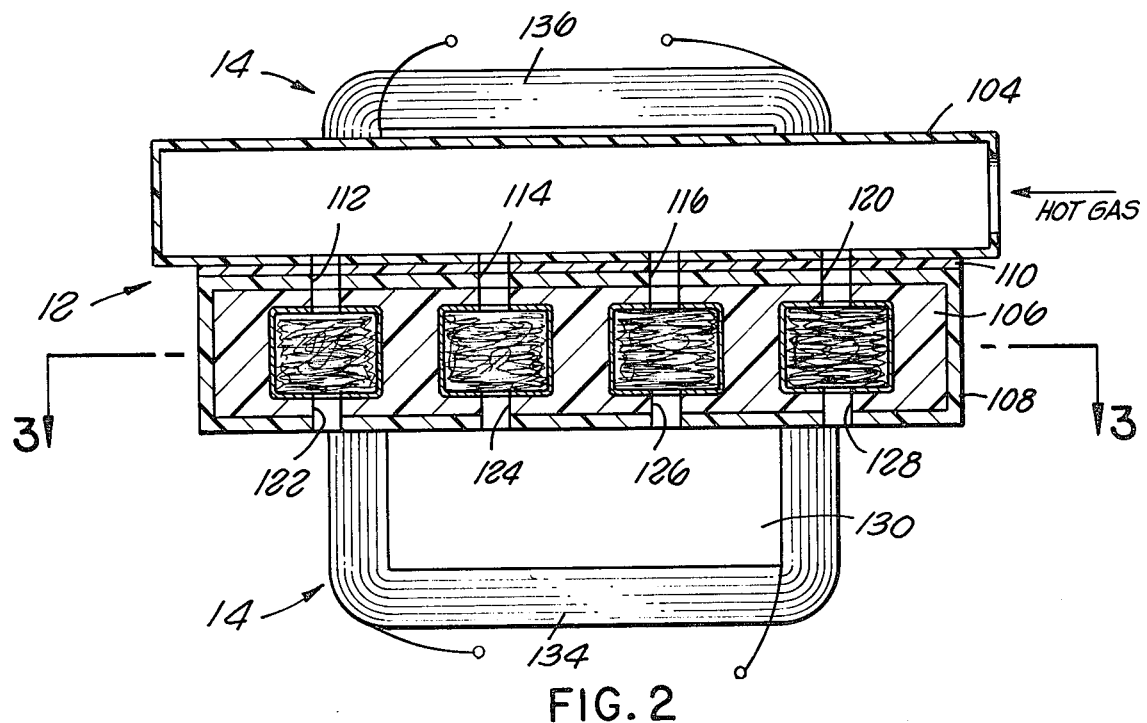
FIG. 2 is a sectional view, taken along the line 2—2 of FIG. 3, of the thermoelectric generator and associated apparatus of FIG. 1.
Figure 3:
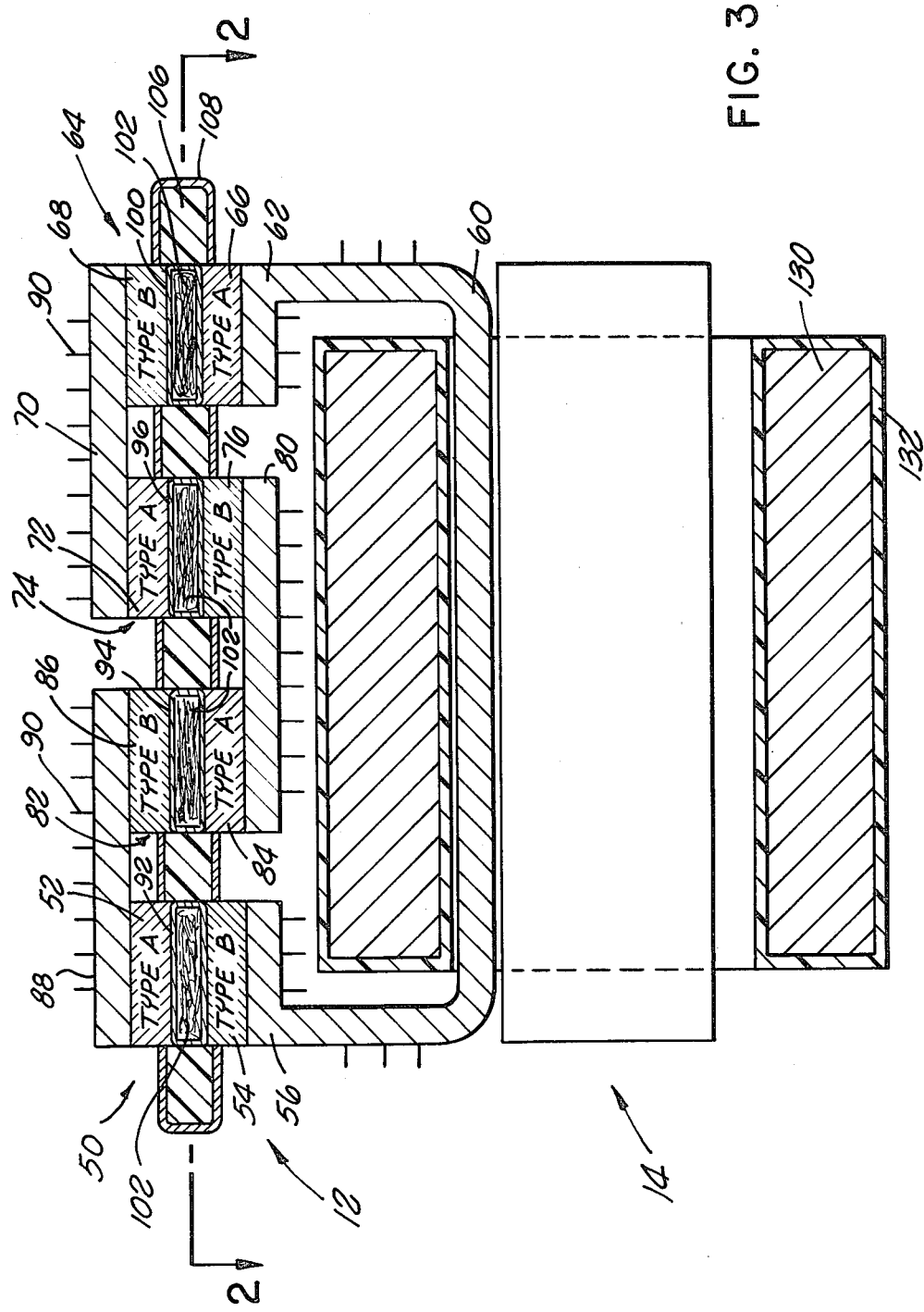
FIG. 3 is a sectional view, taken along the line 3—3 of FIG. 2, of the thermoelectric generator and associated apparatus of FIG. 1.

Summarizing, by way of introduction, a refined thermoelectric generator 12, adapted for cyclical operation in accordance with the invention, is shown in FIGS. 1-3. It is connected, at its output, to refined transformer apparatus 14 which is also particularly adapted for such cyclical operation.

Figure 4:
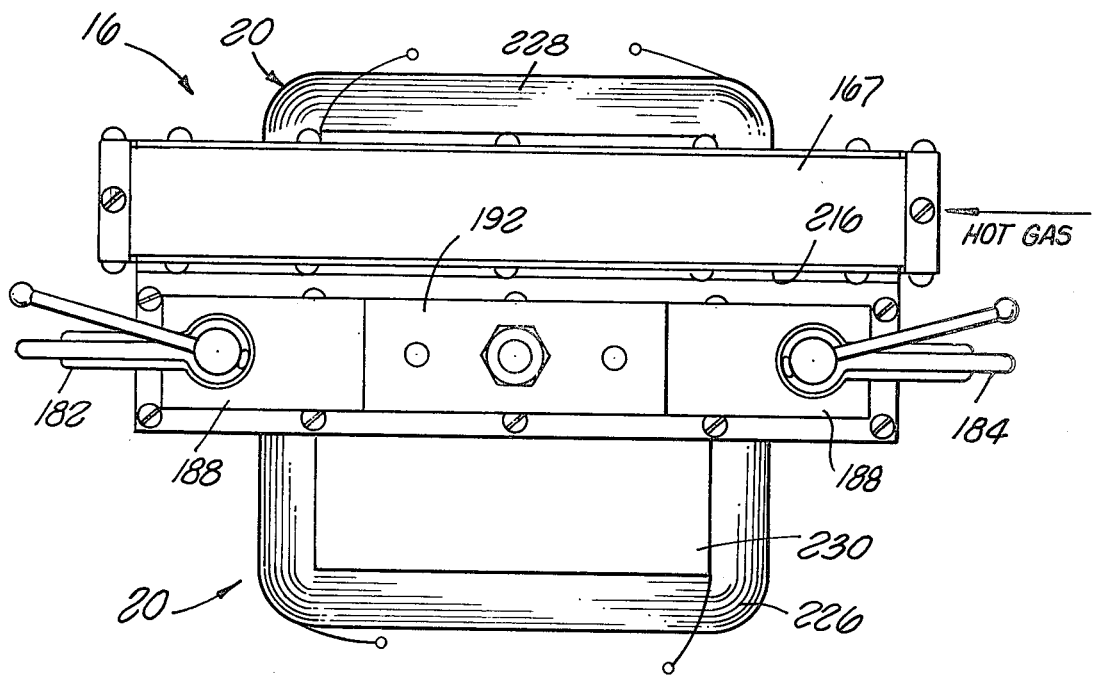
FIG. 4 is another embodiment of a thermoelectric generator adapted to be operated in accordance with method aspects of the invention and provided with output apparatus in accordance with apparatus aspects of the invention.
Figure 5:
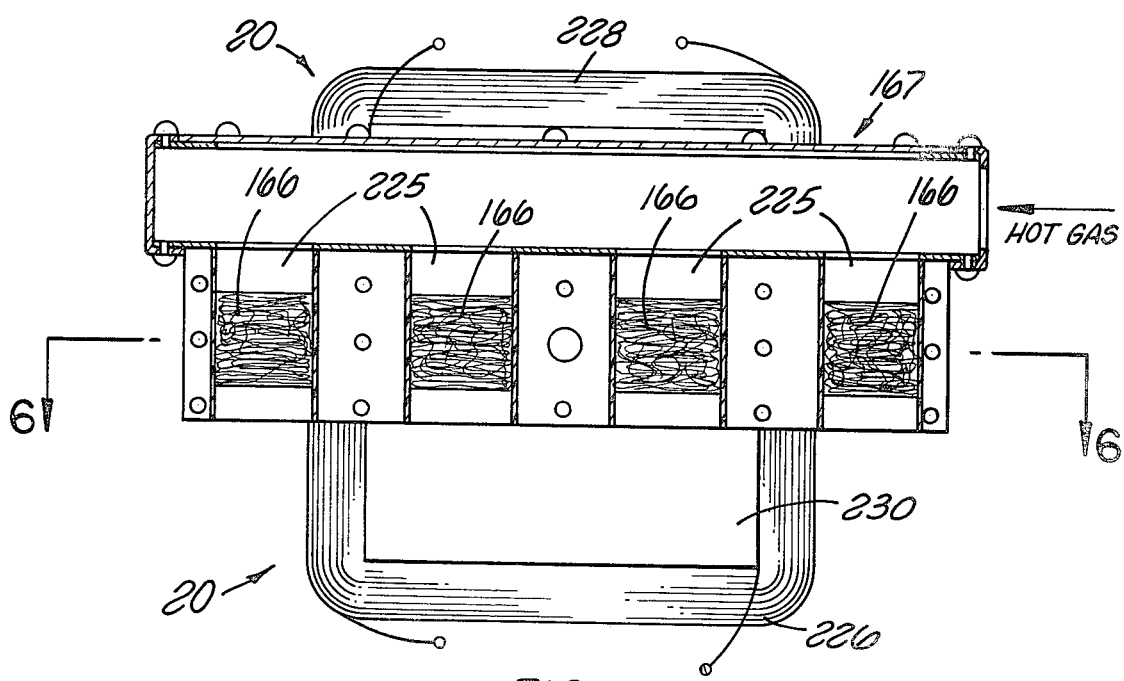
FIG. 5 is a sectional view, taken along the line 5—5 of FIG. 6A, of the thermoelectric generator and associated apparatus of FIG. 4.
Figure 6A:
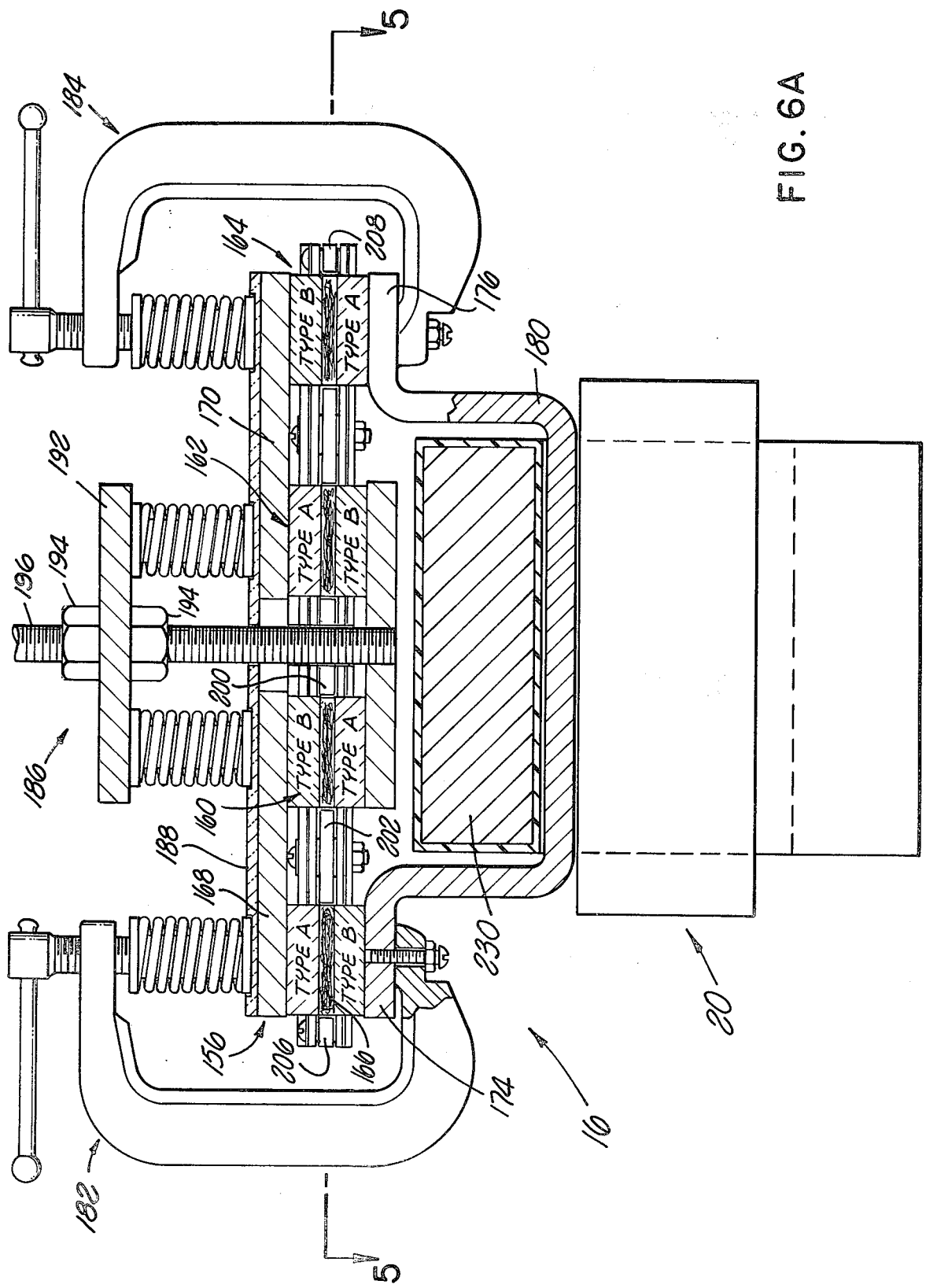
FIG. 6A is a sectional view, taken along the line 6—6 of FIG. 5, of the thermoelectric generator and associated apparatus of FIG. 4.
Figure 6B:
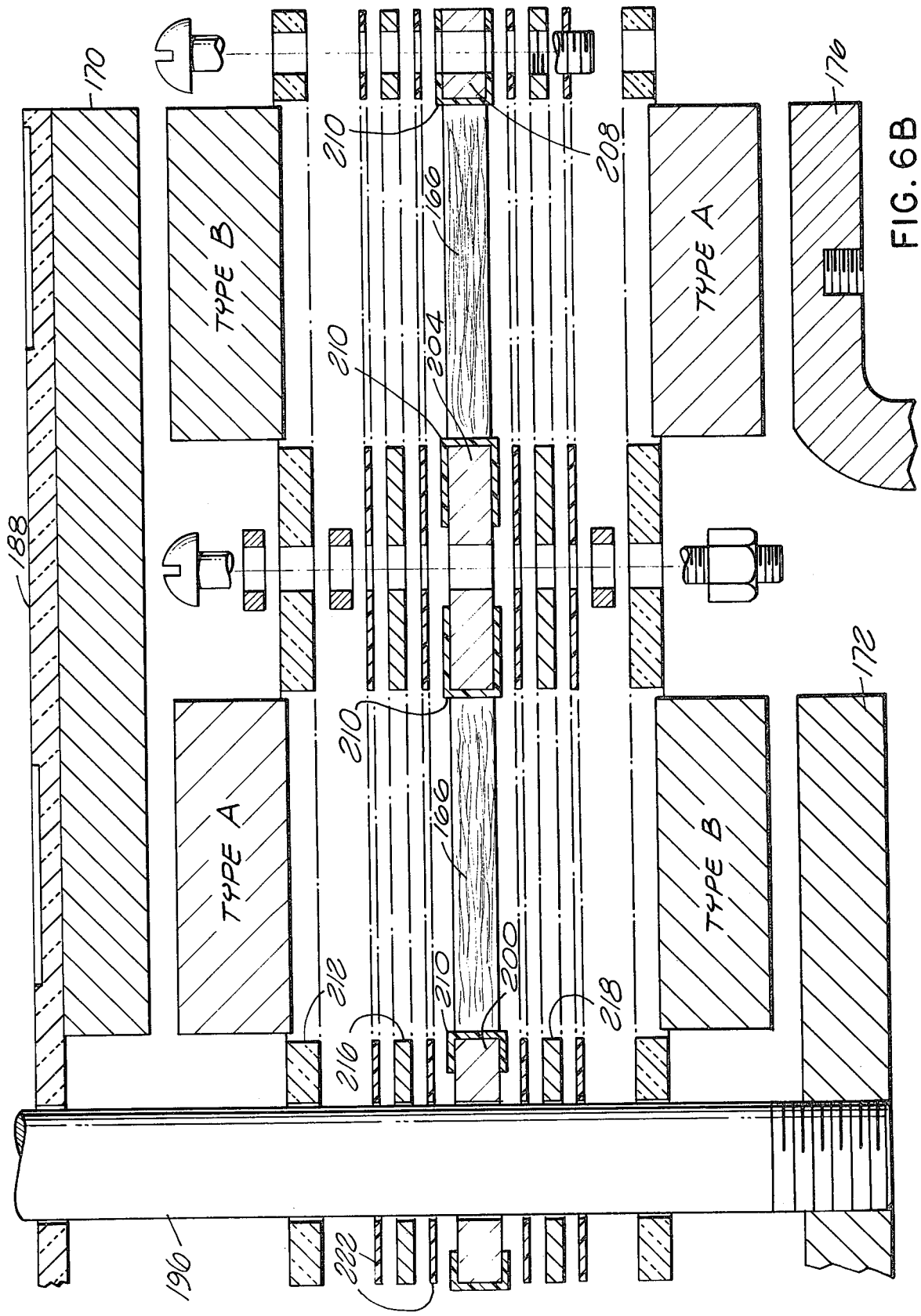
FIG. 6B is an exploded view taken in FIG. 6A.

In FIGS. 4-6 (FIG. 6 referring to FIGS. 6A and 6B), a somewhat similar thermoelectric generator 16 and somewhat similar transformer apparatus 20, particularly suited for testing purposes, are shown.

Figure 9:
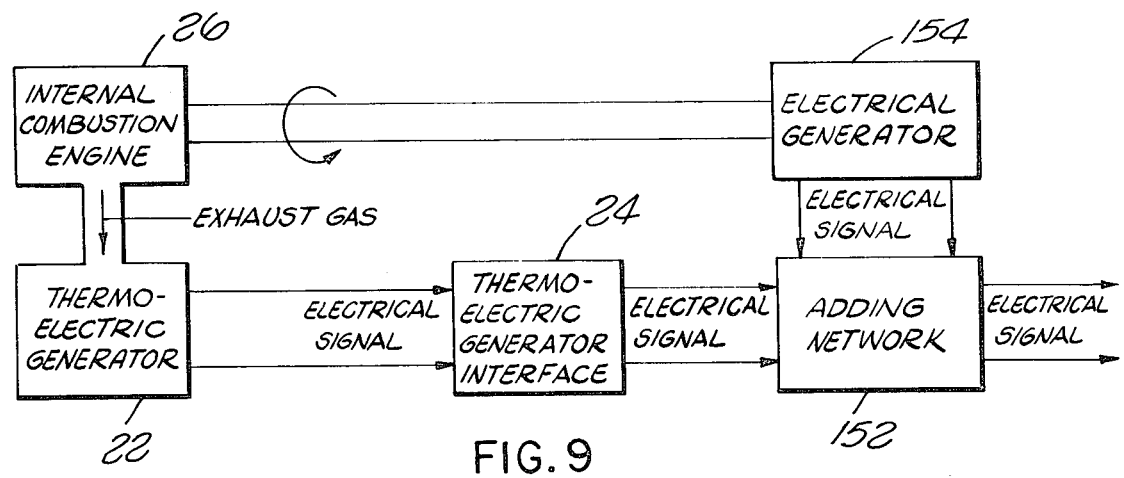
FIG. 9 is a block diagram showing a thermoelectric generator being operated in accordance with method aspects of the invention.
Figure 12:
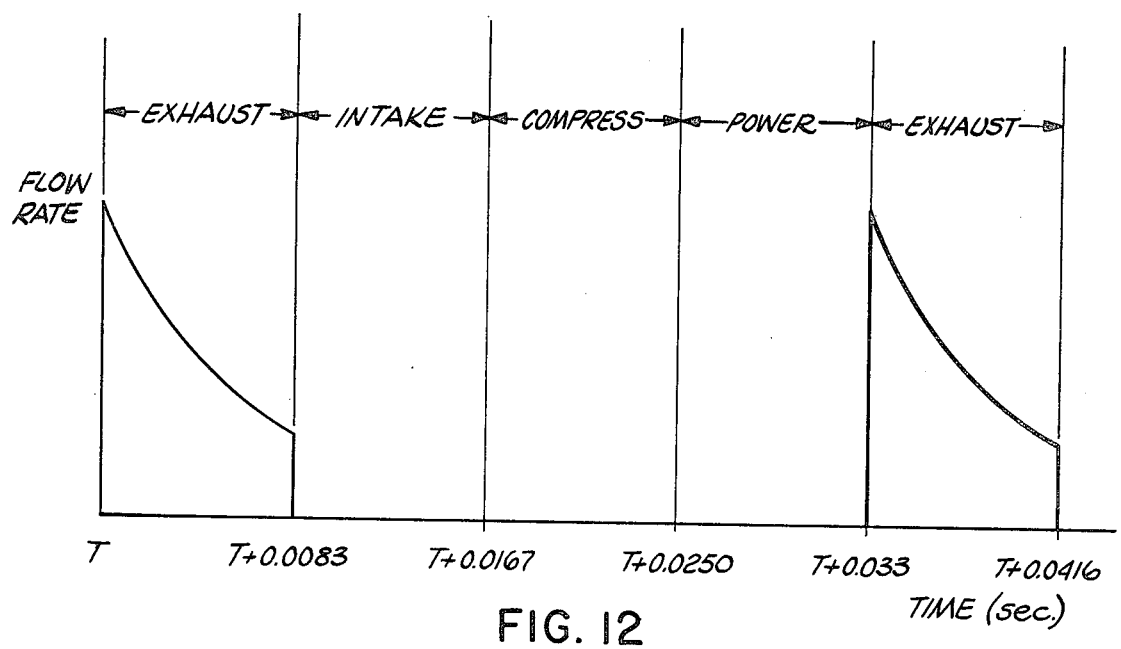
FIG. 12 is a qualitatively illustrative internal combustion engine exhaust flow rate diagram for driving a thermoelectric generator in accordance with method aspects of the invention.

The generator of FIGS. 1-3 or 4-6, together with the associated transformer apparatus, can be provided as the thermoelectric generator 22 and thermoelectric generator interface 24 in an integrated cyclical system for generating and using thermoelectric energy, shown in FIG. 9. A qualitatively illustrative exhaust flow rate diagram for an internal combustion engine (i.e., a combustion engine predicated upon the reciprocation of one or more cylinders) for cyclically operating the generators and transformer apparatus of FIGS. 1-3 and 4-6, is shown in FIG. 12. An internal combustion engine 26, which is incorporated into the integrated system of FIG. 9 as a cyclical heat source, may, by way of example, have a characteristic along the lines of FIG. 12.

FIGS. 15A, 15B and 15C illustrate the advantages that can be derived from the cyclical operation of thermoelectric generators addressed herein.

In FIG. 17, a method of providing cyclical operation of a thermoelectric generator 30, based upon the reciprocating motion of the thermoelectric material of the generator, is shown. In particular, the thermoelectric material legs of a generator having a single thermoelectric cell reciprocate in one direction so that heat can be applied to one set of ends of the legs while heat is removed from the other set of ends. Then, following reciprocation in the other direction, heat is removed from the first set of ends and provided to the second set of ends. This is then followed by reciprocation back to the initial configuration. This process is continued to provide the desired cyclical operation.

In FIGS. 18 and 19, another form of cyclical operation is illustrated. In particular, a solar thermoelectric generator 34 is predicated upon the intermittent application of solar energy. The intermittent effect results from the rotation of a disc which is provided with openings along portions of its circumference for the intermittent transmission of focused solar radiation to intermittently heat the hot ends of the legs of a single thermoelectric cell.

Figure 8A:
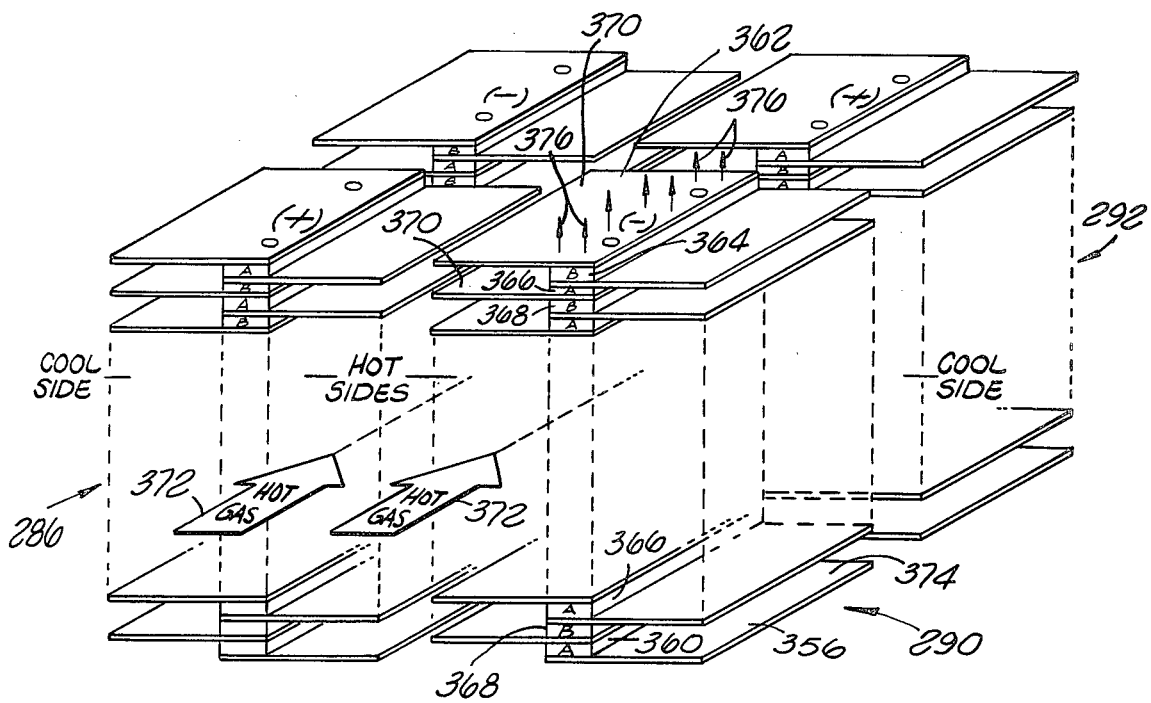
FIGS. 8A and 8B are an exploded view of part of the thermoelectric generator of FIG. 7.
Figure 8B:
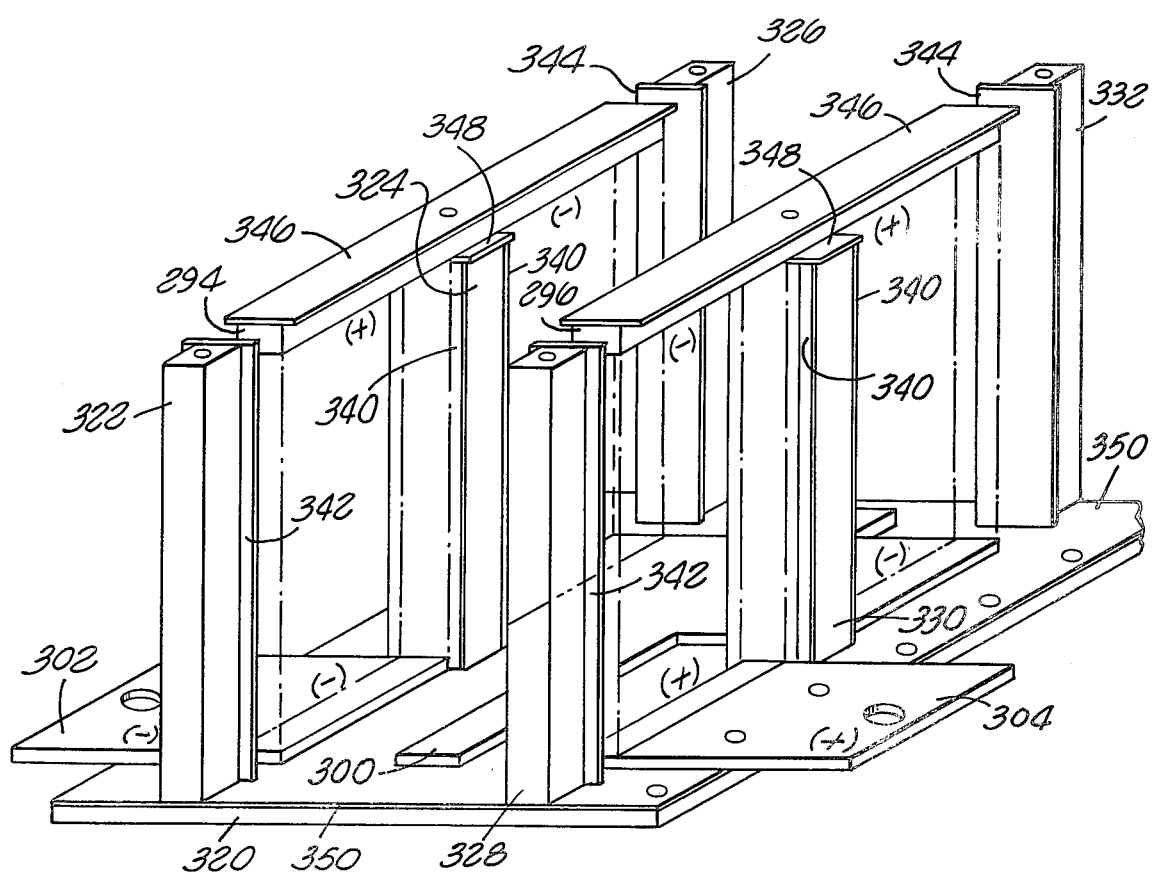

Further summarizing by way of introduction, a stack configuration generator 36, connected to output transformer apparatus 40, is shown in FIG. 7. The transformer apparatus bears considerable similarity to the comparable transformer apparatus of FIGS. 1-3 and of FIGS. 4-6. As is shown in FIGS. 8A and 8B, the thermoelectric power in the generator is generated in four similar, stack configuration thermopiles which are electrically connected in series to, in effect, provide a single multiple-stack thermopile. In accordance with the normal understanding of the term "thermopile", each of the four thermopiles incorporates a number of thermoelectric cells combined in order to multiply the thermoelectric effect derived from a single cell.

The basic structural unit for the thermopiles of the stack configuration generator 36 is a layer of one type of thermoelectric material, a heat conduction fin sandwiched above that layer and extending to one side of the stacked thermoelectric material layers, a thermoelectric material layer of a second type above such fin, and a second heat conduction fin sandwiched above the second thermoelectric material layer and extending to the opposite side of the stacked thermoelectric material layers. The fin extending to one such side is to conduct heat toward the space between its sandwiching layers. The fin extending to the other such side is to conduct heat away from the space between its sandwiching layers.

Figure 10:
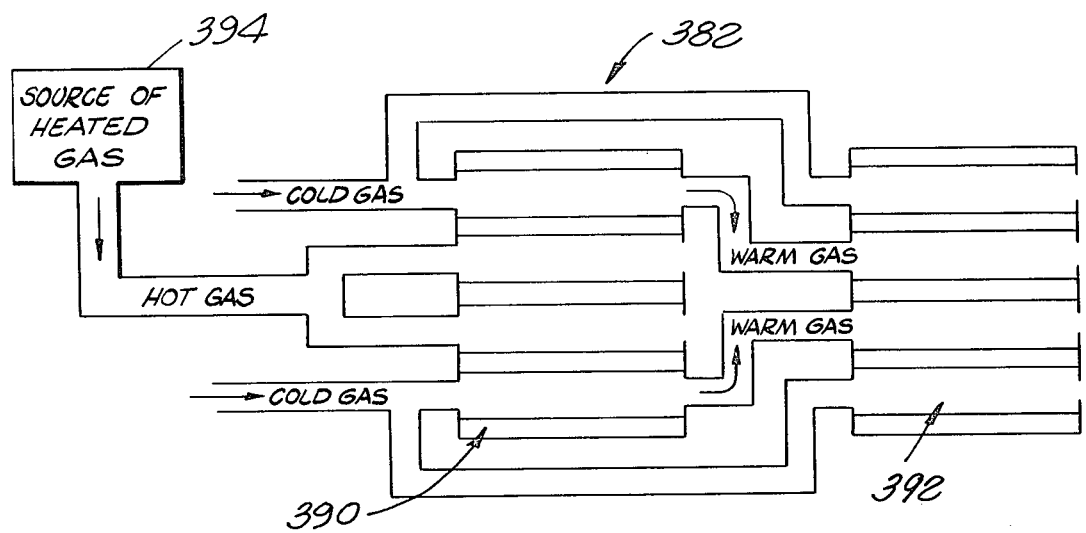
FIG. 10 is a diagrammatic view showing two thermoelectric generators of the type shown in FIG. 7 being driven.

In FIG. 10, two stack configuration thermoelectric generators of the type shown in FIGS. 7 and 8 are together driven by a source of heated gas. Cold gas is provided for cooling along the cool sides of the thermopiles. Such cold gas is necessarily heated by the thermopiles. Thus, this gas from the upstream generator is employed along the hot sides of the thermopiles in the downstream generator. In a variation in FIG. 11, hot gas which is necessarily somewhat cooled along the hot sides of the thermopiles in the upstream generator is employed as the heating gas along the hot sides of the thermopiles in the downstream generator.

With reference to FIG. 16, a constant source thermoelectric generator system 42 is shown providing power to a load 44. In this system, a source of heated gas 46, from the point of reference of a constant source thermoelectric generator 48, provides gas at a substantially constant flow rate and temperature to the generator. The stack configuration generator 36 of FIG. 7 (without the associated transformer apparatus) can be employed as the constant source generator 48 in this system. However, it can also be employed as the thermoelectric generator in a system predicated on cyclical operation, such as the integrated cyclical system of FIG. 9. Along somewhat similar lines, although the thermoelectric generators of FIGS. 1-3 and 4-6 are particularly adapted for cyclical operation, as in the system of FIG. 9, they can also be used (without the associated transformer apparatus) in a constant source system, such as the system of FIG. 16.

Now addressing the subject matter hereof in more detail, the refined thermoelectric generator 12 of FIGS. 1-3 incorporates four thermoelectric cells electrically connected in series. With reference to the view of FIG. 3, there is, first, a left, outside thermoelectric cell 50 having an upper piece of Type A thermoelectric material 52 and a lower piece of Type B thermoelectric material 54. As shown, the pieces of the two types of material have the same, box-like shape.

The bottom end of the lower piece of thermoelectric material 54 is bonded along its full area to a left, bottom contact 56 having an upper face for such bonding. A loop connector 60, which is integral with the left, bottom contact, electrically connects such contact with a right, bottom contact 62 which, also, is integral with the loop connector. The right, bottom contact has the same form as the left, bottom contact. It also serves the same role, with respect to a right, outside thermoelectric cell 64 as does the other bottom contact, with respect to the left, outside thermoelectric cell 50.

The right, outside thermoelectric cell 64, to provide the appropriate series electrical relationship between the two thermoelectric cells, has a lower piece of Type A thermoelectric material 66 and an upper piece of Type B thermoelectric material 68. All the pieces of thermoelectric material in the embodiment of FIGS. 1-3, as shown, have the same shape and size.

A right, top connector 70 has an undersurface which is bonded along the full top end of the upper piece of thermoelectric material 68 in the right, outside cell 64, and also along the full top end of an upper piece of Type A thermoelectric material 72 in a right, inside thermoelectric cell 74. This latter cell, in a fashion comparable to the other, previously described cells, in addition, has a lower piece of Type B thermoelectric material 76 which, along its full bottom end is bonded to the upper surface of an intermediate, bottom connector 80. In order to connect the right, inside thermoelectric cell 74 to a left, inside thermoelectric cell 82, this upper surface of such connector is also bonded along the full bottom end of a lower piece of Type A thermoelectric material in that latter cell.

The left, inside thermoelectric cell 82, in a manner comparable to the other cells, has this lower piece of thermoelectric material 84 and an upper piece of Type B thermoelectric material 86. A left, top connector 88, which is identical to the right, top connector 70, has a lower surface which is bonded to the full top ends of the upper pieces of thermoelectric material 86 and 52 in the left, inside 82 and the left, outside 50 thermoelectric cells. This completes the series electrical connection of the four thermoelectric cells.

The ends of the pieces of thermoelectric material which are bonded to the contacts and connectors are the "cold" ends of the pieces of thermoelectric material in the cells. As indicated, these are the top ends of the upper pieces of thermoelectric material and the bottom ends of the lower pieces of thermoelectric material. The contacts and connectors (including the loop connector 60) have fins 90 mounted therealong to aid in the transmission of heat from these cold ends to the ambient surroundings. Each piece of material, of course, also has a "hot" end. In this case, the hot ends are the bottom ends of the upper pieces of material 52, 86, 72 and 68, and the top ends of the lower pieces of material 54, 84, 76 and 66. Heat is transferred to these hot ends by four hollow, box contacts—one per cell.

Thus, there is a left, outside box contact 92, a left, inside box contact 94, a right inside box contact 96, and a right, outside box contact 100, each for the corresponding thermoelectric cell. With respect to each corresponding cell, the bottom end of the top piece of thermoelectric material is bonded along its full surface to the top face of the corresponding box contact. Similarly, the top end of the lower piece of thermoelectric material is bonded along its full surface to the bottom face of the corresponding box contact. Each box contact is filled with compacted metallic wool 102 to provide sufficient electrical and thermal conductivity to make the box contact with the contact cavity having the metallic wool therein effective as an electrical and thermal contact to the pieces of material to which the box contact is bonded.

The cavity of each box contact is in fluid communication with the cavity of a manifold 104 (FIG. 2). The manifold is adapted to receive hot gas from a source of such gas and to distribute the gas to the cavities of the four box contacts. In order to reduce the escape of heat through the sides of the box contacts, a quantity of buffer material 106, which is a good thermal insulator (as well as a good electrical insulator) is disposed within a hollow, box shell 108 about the sides of the box contacts (FIGS. 2 and 3). Conventional bonding techniques are employed to hold this shell-buffer material structure in position. However, if desired, a tight fit of this structure about the thermoelectric cells can be used to frictionally hold the structure in place. The box shell 108 is attached to a mounting plate 110, which in turn is attached to the manifold 104. The box shell, mounting plate and manifold are also, for convenience, made of material that is a good thermal insulator and a good electrical insulator, although other materials including metallic materials, could be used.

As is shown in FIG. 2, for each box contact, there is an intake passage through the manifold 104, mounting plate 110, box shell 108, buffer material 106, and through the box contact, into the cavity of the box contact. Thus, there is a left, outside 112, a left, inside 114, a right, inside 116 and a right outside 120 intake passage associated with each corresponding box contact and thermoelectric cell. In addition, there is an exhaust passage from the interior of each box contact, through the contact, buffer material and shell, to the ambient surroundings. Thus, there is a left, outside 122, a left, inside 124, a right, inside 126 and a right outside 128 exhaust passage for the corresponding box contact and thermoelectric cell.

The output transformer apparatus 14, associated with the thermoelectric generator 12 of FIGS. 1–3, was briefly adverted to in the introductory descriptive material. The transformer apparatus incorporates a transformer core 130 of a conventional design. The core conveniently can be formed by winding, in the manner of tape, magnetic core material to form the traditional core shape which is shown. The core is provided with a coating of material 132 providing good electrical insulation along all its external surfaces. The loop connector 60, previously described, and which also forms part of the transformer apparatus 14, with the thermoelectric generator 12, forms a single loop inductor about the core. Thus, electrical current passes through the connector, through parts of the thermoelectric generator including each piece of thermoelectric material, and back to the loop connector. This inductor then is the primary, or input inductor for the transformer core. Further, the voltage in this inductor attributable to the inductance for this loop is the output signal for the generator.

This voltage, as is well known in the art, depends upon the derivative of the magnetic flux linkage of the inductor. Further, as is also well known, it is dependent upon the inductance for the loop and the characteristic of the current through the loop. For a time invariant inductance (L), this voltage ((v)(t)), in order to be nonzero, requires a time varying current through the loop, and is dependent upon the inductance and upon the current through the loop (i) according to the following relationship:

$$v(t) = L(di/dt).$$

Thus, it will be appreciated that the thermoelectric generator 12 of FIGS. 1–3, with its output transformer apparatus 14, is particularly adapted for cyclical operation—i.e., for being driven in a manner which creates cyclically increasing then decreasing temperature differences along the pieces of thermoelectric material and a resulting cyclically increasing than decreasing output signal for the generator. In this case, the voltage attributable to the inductance for the primary, input loop for the core is this output signal. This voltage attributable to the inductance for the loop is conveniently termed the "inductor voltage" for the loop. There, of course, will be voltage in the loop attributable to other factors, for example, attributable to the resistance in the loop.

In the embodiment of FIGS. 1–3, there are two secondary, output inductors about the core. With respect to the view of FIGS. 1 and 2, there is a front secondary inductor 134 and a rear secondary inductor 136. In each case, there is a wrapping strip along the inside of the inductor and a wrapping strip around the outside of the inductor to provide electrical insulation and to tightly hold the inductor in position. The use of two secondary inductors, rather than one, is a matter of choice, as is well understood by those knowledgeable in the art. Thus, the embodiment of FIGS. 1–3 is adapted to provide two output signals from the transformer apparatus rather than one.

It is noteworthy that a typical problem for thermoelectric generators is the relatively low voltage which individual thermoelectric cells provide. This results in the traditional use of series-connected thermoelectric cells. Nevertheless, even with a substantial number of thermoelectric cells in series, the common situation is a rather low voltage and a rather high current, which high current can be difficult to deal with. With reference to this situation, the transformer apparatus 14 of FIGS. 1–3 conveniently provides a way to convert a relatively low voltage and a relatively high current produced by a thermoelectric generator, to a higher voltage and a lower current by transformer voltage step-up and current step-down action. Moreover, as is well known, a transformer is specifically adapted for cyclical operation. Therefore, the transformer apparatus 14 of FIGS. 1–3 is particularly adapted for interaction with a thermoelectric generator which is driven in a cyclical manner.

Some matters of interest with reference to cyclical operation of thermoelectric generators, along the lines described herein, are illustrated in FIGS. 15A and 15B. In FIG. 15A, a thermoelectric cell having a leg of Type A material 138 and a leg of Type B material 139 is shown. A hot contact 140 connects the legs at their hot ends. Separate cold contacts 141 and 142 with a load 143 therebetween collect heat from the cold ends of the legs.

FIG. 15B qualitatively illustrates temperature profiles along a leg of the thermoelectric cell of FIG. 15A at three points in time. The points in time occur after the heating of the hot contact 140 is such that the hot ends of the legs have been heated to a maximum temperature T(H) which is substantially higher than the melting temperature T(M) of the leg which is the subject of the temperature profiles. As is apparent, it is assumed that the situation at the hot contact 140 and at the cold contacts 141 and 142 is such that the hot ends of the legs are maintained at the temperature T(H) and the cold ends of the legs are maintained at the temperature T(C) during the relevant period.

At time 1, the temperature difference between the hot and cold ends of the leg for which the profile is illustrated, is such that the thermoelectric voltage between the ends (assuming, for ease of explanation and understanding, the Seebeck coefficient and other relevant material characteristics do not vary with temperature) is attributable to the temperature difference T(H) minus T(C). At times 2 and 3, the temperatures at, and the voltage between, the ends of the leg are the same as at time 1. However, due to the conduction of heat from the hot towards the cold end, the temperature profile along the leg changes and, in fact, by time 3, the profile is linear. A large temperature difference between the ends of the leg is favorable from the perspective of the magnitude of the thermoelectric voltage. However, such a difference predicated upon a temperature at the hot end which is above certain levels, determined with respect to the particular material, is typically avoided due to changes in the character of the material which interfere with the desired thermoelectric effect.

This is illustrated in FIG. 15B, wherein the temperature at the hot end of the leg profiled is substantially greater than the melting temperature of the material of that leg. Thus, as time passes, undesirable melting of material in the leg would be expected. By way of example, perhaps such melting will commence at a time when the temperature profile is between the profiles of time 2 and time 3. In such a case, if the temperature situation in the leg is controlled such that increasing then decreasing temperatures are cyclically produced in the leg, then the temperature profile at which melting commences can be avoided, while the advantage of temperature differences predicated on temperatures above the melting point can be derived. Again by way of example, according to a cyclical process, heating might be provided until a profile somewhat along the lines of the time 1 or time 2 profile is established. Then, heating might be terminated until a profile in which all temperatures are substantially less than the melting point is established. Then, heating can be recommenced until the first profile is re-established, and so on in a cyclical process.

With respect to the above discussion of FIGS. 15A and 15B, a number of aspects of the situation should be noted. First, the illustration assumes that the thermoelectric materials extend to the ends of the contacts. As a variation on this, for purposes of further illustration, one might, for example, assume that due to the nature of the thermoelectric material and/or the manner of constructing the cell and/or the environment of the thermoelectric cell, that thin sheets of an oxide of the Type A and Type B materials form between the Type A and Type B materials and the hot contact.

This is illustrated in FIG. 15C showing a thermoelectric cell which is assumed to be the same as the cell of FIG. 15A in all respects but for such sheets of oxides of the thermoelectric materials. Thus, there is a hot contact 145, two cold contacts 146 and 147 (also a load 148 for the cell) and a leg 149 of Type A thermoelectric material and a leg 150 of Type B thermoelectric material. In addition there is a thin sheet 151 of an oxide of the Type A material between the Type A leg and the hot contact and a thin sheet 152 of an oxide of the Type B material between the Type B leg and the hot contact.

The widths of these sheets are exaggerated for illustration. Typically, oxide layers of this general sort might be a matter of some tens of Angstroms ($10^{-8}$ cm.) (e.g. in the range of 25 Angstroms) in width. Of course, and similarly, in FIG. 15B, the width of the portion of the thermoelectric material that exceeds the melting temperature of such material at illustrative times 1 and 2 also is exaggerated, for purposes of illustration, over what might more typically occur. Again, a width of some tens of Angstroms for such a portion would be typical.

With respect to FIGS. 15B and 15C, it is particularly noteworthy, however, that even with a thin intervening layer (for example of an oxide of the thermoelectric material of the leg) present, penetration into the thermoelectric material itself, as opposed to merely the intervening layer, of temperatures substantially exceeding the melting temperature of the thermoelectric material can readily be provided according to a cyclical process such as that outlined in connection with FIG. 15B.

Several of a variety of usefully illustrative examples might be cited with respect to the situation of FIGS. 15A, 15B and 15C. Thus, by way of example, parts of aluminum cylinders in engines traditionally are intermittently elevated to temperatures above the melting temperature of aluminum in the repetitive process involved in the operation of the engine. In this regard, the melting point of aluminum is about 660 degrees centigrade; however, aluminum cylinders typically are intermittently subjected to temperatures in the range of about 2500 degrees centigrade without melting. Even though such cylinders will typically have a thin metallic oxide case along their outside surfaces, temperatures well above 660 degrees centigrade will penetrate below this case during operation.

Further by way of example, and on a much more elementary level, a bar of aluminum can be subjected to temperatures for a substantial period of time, without melting, while the same temperatures will rapidly melt a piece of aluminum foil. This disparity will occur for an aluminum rod and aluminum foil with or without an oxide of aluminum coating along their outside surfaces.

FIG. 12 qualitatively illustrates an exhaust flow rate along the lines of that which can be provided by a conventional one cylinder internal combustion engine. Thus, in FIG. 12, as the engine goes through its exhaust, intake, compress, and power periods, cyclically repeating them, during the exhaust period, the flow rate of the hot exhaust gas from the engine abruptly increases, less abruptly decreases for about 8.3 milliseconds to an intermediate level, then abruptly decreases to essentially 0. During each of the other three periods, which are approximately equal in time to the exhaust period, the flow rate is essentially 0. An internal combustion engine with this sort of characteristic is an example of such an engine which is satisfactory for producing the cyclically increasing then decreasing thermoelectric material temperature differences upon which the cyclical operation of the thermoelectric generator 12 of FIGS. 1-3 is predicated. Of course, the exhaust outlet of the engine must be sufficiently close to the entrance of the manifold 104 to establish the desired cyclical type of operation. In particular, if the engine is too far away from the manifold, the substantially cyclical nature of the input to the manifold will be averaged out to a substantially constant input and not provide the type of cyclical operation desired.

Figure 13:
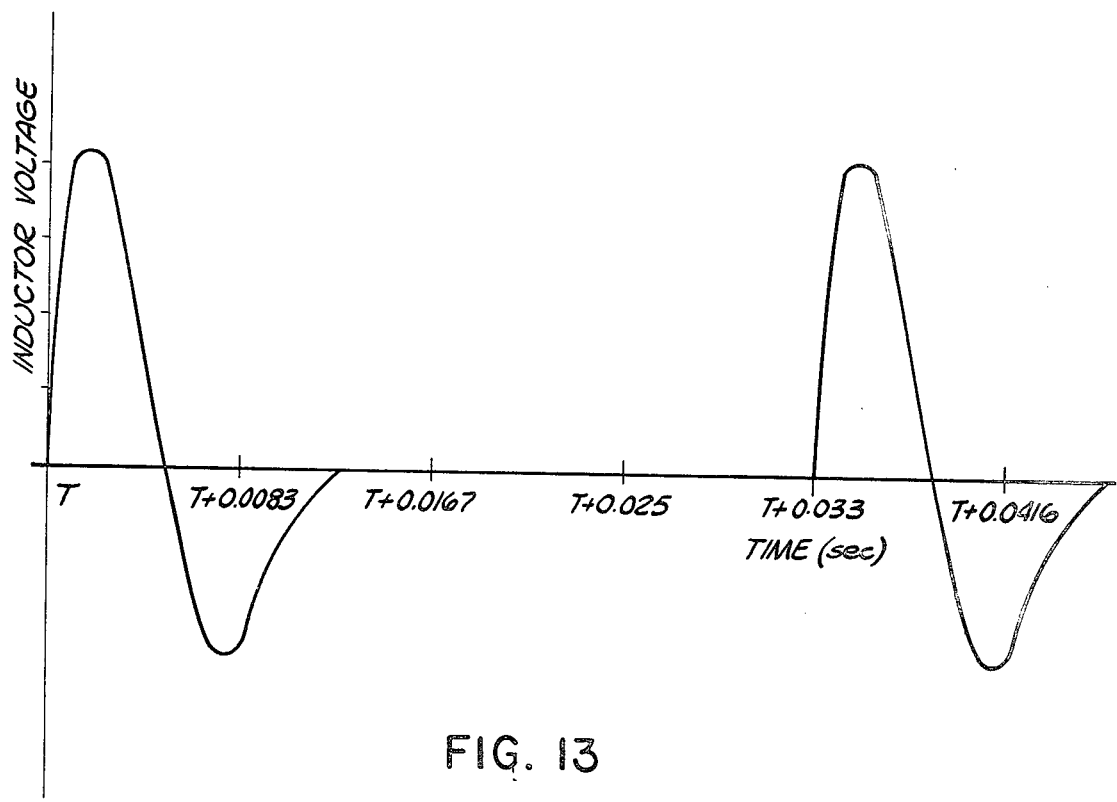
FIG. 13 is a voltage versus time diagram intended to qualitatively illustrate the driving of a thermoelectric generator by an internal combustion engine having the flow rate characteristic of FIG. 12.

FIG. 13, in very general fashion, qualitatively illustrates the general type of generator output signal (inductor voltage for the primary, input inductor loop) one would expect in the embodiment of FIGS. 1-3 driven by an internal combustion engine having a flow rate characteristic along the lines of FIG. 12. In the course of its cyclical variation, the generator output signal of FIG. 13 rises to a peak voltage during the exhaust period of the engine. It crosses 0 and falls to a minimum voltage, still during this period, then returns to 0 during the intake period of the engine. The same pattern is repeated with the onset of the next exhaust period of the engine. The voltage across one of the two secondary inductors of FIGS. 1-3, for an ideal transformer, would have the same form as FIG. 13, but each voltage level would be the corresponding level of FIG. 13 multiplied by $N_2/N_1$, where $N_2$ is the number of turns in the secondary inductor and $N_1$ is equal to 1, the number of turns in the primary inductor. It is again emphasized that the diagrams of FIGS. 12 and 13 are exemplary, for purposes of illustration.

FIG. 9 shows an integrated, cyclical thermoelectric system of a type in which an internal combustion engine having a characteristic along the lines of FIG. 12, and in which the thermoelectric generator 12 and transformer apparatus 14 of FIGS. 1-3, may be employed. Thus, an internal combustion engine having a characteristic along the lines of FIG. 12 would then be the internal combustion engine 26 of FIG. 9, and the thermoelectric generator 12 of FIGS. 1-3 would be the thermoelectric generator 22 of FIG. 9. Similarly, the transformer output apparatus 14 of FIGS. 1-3 would be the thermoelectric generator interface 24 of FIG. 9. The output of one of the secondary inductors 134 or 136 of FIGS. 1-3

(though a single secondary inductor could readily be substituted) would then be provided to a conventional electrical adding network 152. A conventional electrical generator 154, of a type that is traditionally used with an internal combustion engine, converts energy from the shaft of the engine 26 to electrical power, which is also provided to the adding network. The adding network, which may incorporate apparatus to convert time varying signals to D.C. signals, then, from the two input electrical signals it receives from the interface 24 and electrical generator 154, provides a single electrical output signal. The system of FIG. 9 is illustrative of how the thermoelectric generator 12 and transformer output apparatus 14 of FIGS. 1–3 may be employed to convert heat from a vehicle engine, which is otherwise wasted, to electrical power which can be effectively utilized.

Referring again to FIGS. 1–3, the Type A pieces of material and the Type B pieces of material can be selected from a variety of material pairs which are compatible. By way of example, either the Type A material or the Type B material can be a P-type semiconductor utilized for its thermoelectric properties. Then the other type material can be an N-type semiconductor utilized for its thermoelectric properties which is compatible with the P-type material. Good examples are a P-type bismuth telluride ($Bi_2Te_3$) material and an N-type bismuth telluride material. Such materials, of course with P-type doping in one case and N-type doping in the other, are conventional and readily available. Convenient choices for the P- and N-type bismuth telluride materials are the Ohio Semitronics polycrystalline thermoelectric grade materials respectively designated P-BT-2P7 and N-BT-2N7. Conventional bismuth telluride alloys, also appropriately doped, can also conveniently be employed.

With respect to the use of P-type and N-type semiconductors, such semiconductors, by way of contrast with metallic thermoelectric material pairs, provide the advantage of thermoelectric voltages which add to one another in a thermoelectric cell rather than thermoelectric voltages which subtract from one another. Thus, P/N semiconductor thermoelectric cells are predicated upon a summing effect from the two materials. On the other hand, metallic thermoelectric material pairs have voltages which tend to cancel out one another. Thus, thermoelectric cells using metallic thermoelectric materials, and which are intended to provide power (rather than, for example, measure heat levels), are predicated upon a desire for metallic materials that have substantial differences in their thermoelectric voltages, since the power available for transmittal by the generator depends on this difference. Semiconductors for thermoelectric applications, as a class, also are typically thought of as offering the advantages of higher Seebeck Coefficients and lower thermal conductivities than metallic thermoelectric materials.

On the other hand, semiconductors for thermoelectric applications, as a class, are typically thought of as carrying certain important disadvantages over metallic thermoelectric materials. These typical disadvantages are less long term stability, increased difficulty of manufacture and cost of manufacture, and less capability to withstand severe environments.

A wide variety of compatible metallic thermoelectric materials, thus, can also be used as the Type A and Type B materials in the embodiment of FIGS. 1–3. One example is an alloy having nickel and chromium as its primary constituents, as one of the materials, and an alloy having copper and nickel as its primary constituents, as the other material. Another example is the nickel-chromium choice, again, as one type, but an alloy having nickel and manganese as its primary constituents, as the other choice. A third example is the copper-nickel alloy as one choice with iron as the other choice. A fourth example is the copper-nickel alloy, again, as one choice, with copper as the other choice.

The above are four conventional examples of many which should be readily apparent to those knowledgeable in the art. With respect to the alloys noted, an alloy sold under the trademark Chromel is a convenient choice for the nickel-chromium alloy; an alloy sold under the name Alumel is a convenient choice for the nickel-manganese alloy; and an alloy sold under the name Constantan is a convenient choice for the copper-nickel alloy. These particular materials are well known and readily available.

Still referring to the embodiment of FIGS. 1–3, the left, top connector 88, the right, top connector 70, the intermediate, bottom connector 80, the right, bottom contact 62, the loop connector 60 and the left, bottom contact 56 should be made of material with excellent electrical and thermal conductivity, for example of heavy duty copper. Where these items are bonded to thermoelectric material, this bonding can be by a variety of conventional techniques such as surface welding, electroplating, or heat clading techniques. Where the thermoelectric material is a semiconductor material, for example, a bismuth telluride material, a choice such as copper can result in degradation of the material by migration of copper into the material. In such case, the copper can be plated, e.g., by nickel or chromium.

The fins 90 should be of a material having excellent thermal conductivity. Thus copper, which might conveniently be nickel or chromium plated, again is a convenient choice.

With respect to the box contacts 92, 94, 96 and 100, they also should have good electrical and thermal conductivity; and they also can be bonded to the pieces of thermoelectric material by a variety of conventional methods, such as surface welding, electroplating and heat clading techniques. To provide good electrical and thermal conductivity, copper box contacts are convenient. To avoid degradation of pieces of thermoelectric semiconductor material, again, the copper can be plated with, e.g., nickel or chromium.

The compacted metallic wool 102 can be of a variety of metallic materials. Stainless steel wool is a convenient, readily available choice. A variety of other forms other than metallic wool, of course, could fulfill the requirements of the metallic wool. For example, forms of sintered metallic material could be employed.

A particularly convenient choice of material for the manifold 104, mounting plate 110 and box shell 108, is a ceramic material sold under the name Macor (Machinable Glass Ceramic) by Corning Glass Works. The buffer material 106 can be made of a wide variety of common materials which are good thermal and good electrical insulators.

Turning to the transformer core 130, a wide variety of well known magnetic materials may be employed. However, a particularly favorable material for the core, which, as previously indicated, can be formed of material wound in the manner of tape, is M6 silicon steel. The core, of course, should be able to tolerate the magnetic field attributable to rather high currents passing through the loop connector 60, without being saturated. Matters such as this, of course, are well understood by those skilled in the art. The front and rear secondary inductors 134 and 136 should be formed of insulated wire. Insulated wire sold under the name Polythermalize by Essex Wire & Cable is a readily available choice.

Figure 14:
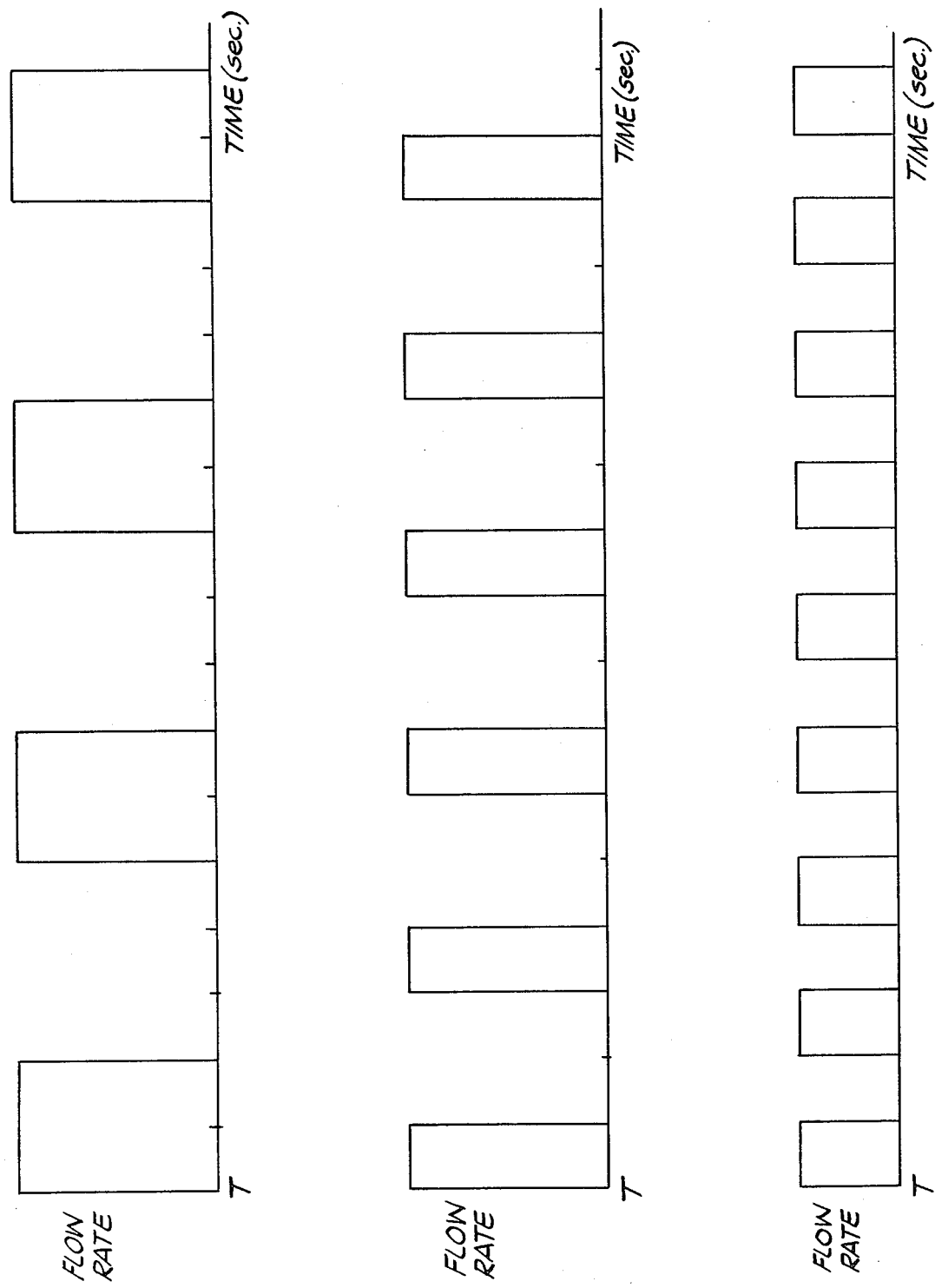
FIG. 14 shows three additional, qualitatively illustrative internal combustion engine exhaust flow rate diagrams for driving a thermoelectric generator in accordance with the invention.

Referring, briefly, back to FIG. 12, it should be emphasized that this graph of exhaust flow rate versus time is just one example of many choices of cyclical patterns of providing heat, which may be utilized for a thermoelectric generator such as the generator 12 of FIGS. 1–3. By way of illustration, one might take as a basic idealized pattern, rectangular pulses, representing periods of hot exhaust gas flow at a set rate, with periods of no flow therebetween equal to the periods of flow. Then, idealized variations on this basic pattern relating to pulse heights, pulse widths, and intervals between pulses in great variety can be conceived. Of course, one can then also conceive of patterns in which shapes other than rectangles appear, and, also, in which, instead of periods of zero flow, there are periods of lower rates of non-zero flow. Thus, it should be evident that a great variety of choices are readily available. FIG. 14 is somewhat illustrative. In the top graph, there are equal periods of flow of hot exhaust gas at a set rate, with periods of no flow which are equal to the periods of flow multiplied by 1.5. In the middle graph, the flow rate is the same, but the equal periods of flow are one-half and the equal periods of no flow are two-thirds of the corresponding periods in the top graph. In the bottom graph, the flow rate is one-half of that in the other graphs, and the periods of flow and no flow are each equal to the periods of flow in the middle diagram. The bottom diagram could then be viewed as the basic idealized pattern, and the top and middle diagrams as idealized variations thereof.

Now turning to FIGS. 4–6 (FIG. 6 referring to FIGS. 6A and 6B), as was previously noted, the thermoelectric generator 16 and transformer output apparatus 20 shown in these figures are along the general lines of the embodiment of FIGS. 1–3, but particularly adapted for testing purposes. Thus, in the generator 16, there is a left, outside 156, a left, inside 160, a right, inside 162 and a right, outside 164 thermoelectric cell. Each such cell has an upper piece of thermoelectric material of one type and a lower piece of thermoelectric material of another type, all having the same box-like shape and size. A quantity of compacted stainless steel wool 166 is squeezed between the bottom end of the upper piece of thermoelectric material and the top end of the lower piece of thermoelectric material in each cell, to provide both an electrical and a thermal path. Hot gas will then enter the manifold 167 and be transmitted to, through and then exhausted away from the quantity of compacted stainless steel wool between the pieces in each cell. This, of course, is to provide the hot junction for the thermoelectric cell. The Type A material in each cell is a P-type bismuth telluride material and the Type B material is an N-type bismuth telluride material. Specifically, these materials are the Ohio Semitronics materials identified above with reference to the embodiment of FIGS. 1–3.

The four thermoelectric cells 156, 160, 162 and 164 are connected in electrical series. To accomplish this, there is a left, top connector 168, a right, top connector 170, an intermediate, bottom connector 172, a left, outside bottom contact 174, a right, outside bottom contact 176, and a loop connector 180 which is integral with the bottom contacts. As is well evident in FIGS. 4–6, these items are comparable in structure, position and function to the like-named items in the embodiment of FIGS. 1–3. They are made of nickel-plated copper. In the embodiment of FIGS. 4–6, the upper connectors 168 and 170, the intermediate, bottom connector 172 and the bottom contacts 174 and 176 are not bonded to the surfaces of the pieces of thermoelectric material which they contact. However, they are held in intimate contact with such surfaces by a clamp system.

This clamp system includes two conventional C-type spring clamps and a conventional two-spring arrangement. In particular, there is a left spring clamp 182, a right spring clamp 184 and an intermediate two-spring arrangement 186. The axis of the left C-clamp is along the left, outside thermoelectric cell 156; the axis of the right C-clamp is along the right, outside thermoelectric cell 164; and the axes of the two-spring arrangement 186 are along each of the left, inside thermoelectric cell 160 and the right, inside thermoelectric cell 162. Typical appropriate pressures for the clamp system are 100 pounds at the top and 100 pounds at the bottom for each spring. A top sheet of epoxy glass 188, along the top of the left, top connector 168, and of the right, top connector 170, is disposed between the springs and the connectors. Such epoxy glass is a convenient structural material. However, its essential purpose is to provide electrical insulation with reference to the upper parts of the spring system, to prevent the spring system from shorting the current which passes through the thermoelectric cells. With this form of electrical insulation, care must be taken because the epoxy glass tends to wear down due to the pressure of the spring system. Thus, the top sheet of epoxy glass 188 must be changed when it is in danger of wearing through to the top connector 168 and 170. Alternatively, a sheet of mica could readily be substituted to provide the electrical insulation.

With regard to the two-spring arrangement 186, as is apparent from the drawings, a bar 192 is positioned between two nuts 194 which are on a bolt 196, to provide downward pressure on the two springs. The upward pressure results from the threadable connection between the bolt and the intermediate, bottom connector 172, which results in such bolt pulling upwardly on such connector.

As is evident from the drawings, there is a layered assembly generally about the inner ends of the pieces of thermoelectric material and about the compacted stainless steel wool 166. Stated in another way, there are openings through the assembly for the pieces of thermoelectric material and for the compacted stainless steel wool. As with much of the generator 16, the layered assembly is constructed substantially symmetrically with respect to a widthwise centerline and, therefore, is essentially revealed for both halves through the detailed exploded view of the half shown in FIG. 6B. The basic purposes of the assembly are to block the lateral escape of the gas which flows through the compacted stainless steel wool; to provide channels to the stainless steel wool and from the stainless steel wool (see FIG. 5); to provide structure to attach the pieces of thermoelectric material and associated parts to the manifold 167; and to do the foregoing while incorporating necessary electrical insulation therein and being easy to construct for test purposes.

In the nature of the central parts of the layered assembly are a central 200, a left, intermediate 202, a right, intermediate 204, a left, outside 206 and a right, outside 208 separator. These separators are metallic blocks, with the central and intermediate blocks having one width and the outside blocks having another, smaller width. They are laterally opposite the quantities of compacted stainless steel wool 166. They have loops of mica 210 about one or both of their lateral ends to electrically insulate them from the quantities of stainless steel wool. For convenience and ease of construction, they are made of nickel-plated cold rolled steel.

The remainder of the layers are each integral and can most readily be described by reference to the centermost portion of the layers in the vicinity of the bolt 196 which forms part of the two-spring arrangement 186. In particular, there is an upper 212 and a lower 214 assembly sheet of glass epoxy. In addition, there is an upper 216 and a lower 218 assembly sheet of nickel-plated cold rolled steel. Such upper sheet is sandwiched between a set 222 of upper assembly sheets of mica; and such lower sheet is sandwiched between a set 224 of lower assembly sheets of mica.

As is evident in FIGS. 4 and 6, screws, washers and nuts, for attachment purposes, also are appropriately employed in association with the layered assembly. The upper assembly sheet of nickel plated cold rolled steel 216 curves upwardly at the rear of the assembly for attachment to the manifold 167 (FIG. 4). Similarly, the lower assembly sheet of nickel plated cold rolled steel 218 curves downwardly at the rear of the assembly for similar attachment (not shown). The manifold 167 conveniently is also made of nickel-plated cold rolled steel. The assembly provides channels 225 for the intake of gas to each thermoelectric cell from the manifold 167, for the passage of the gas through the quantities of stainless steel wool 166 and for the exhaust of the gas to the ambient surroundings.

Comparing FIGS. 4–6 with FIGS. 1–3, it is readily apparent that, in a manner analogous to the embodiment of FIGS. 1–3, the embodiment of FIGS. 4–6 provides an electrical path, through the loop connector 180 of the transformer apparatus 20 and through the thermoelectric generator 16, of a single electrical loop, which loop forms the primary, input inductor for the transformer apparatus 20. Thus, again, with the cyclical provision of heat, the inductor voltage of this loop provides the output signal of the generator. Further, in a fashion comparable to the embodiment of FIGS. 1–3, the embodiment of FIGS. 4–6 has a front, secondary inductor 226, and a rear, secondary inductor 228, about the core 230 of its transformer apparatus, with wrapping strips associated with such inductors. The secondary inductors are each 50 turns of 18-gauge copper wire provided with varnish insulation. The core, wound in the manner of tape, is formed of 22-gauge magnetic material. The material is sold under the name Hypersil by Allegheny-Ludlum. The dimensions of the core at its extreme points are: between the outside surfaces from left to right—about 9.5 centimeters (3.8 inches); between its outside surfaces from front to back and from top to bottom—about 11.4 centimeters (4.5 inches); and between the inside surfaces from top to bottom and from front to back—about 5.8 centimeters (2.3 inches). Concerning other dimensions, the pieces of thermoelectric material have lengths, widths and thicknesses of 2.54 centimeters (1 inch), 2.54 centimeters (1 inch) and 0.64 centimeter (¼ inch), respectfully.

A thermoelectric generator and associated transformer apparatus, which is essentially as shown in FIGS. 4–6 and described immediately above, was connected to a combination engine-electrical generator where the muffler normally is attached to the engine exhaust pipe. There was no muffler, and there was no load on the electrical generator. The engine had a flow rate characteristic which is modeled by FIG. 12. In particular, the exhaust, intake, compress and power periods substantially were those shown in FIG. 12. Further, the flow rate variation of FIG. 12 is along the lines of what would be expected for an engine of the type employed. The engine was a Craftsman 4-horsepower, 4-cycle, 1-cylinder engine, which comes as a package with an 1800-watt generator (alternator and rectifiers) which the engine drives. The engine-generator is designated the Model 580.32711.

One of the two 50-turn secondary inductors of the transformer output apparatus 20 was connected to a Tektronix 511 oscilloscope using a 5A13N amplifier plug-in. The time base plug-in was a 5B10N. The voltage waveform across the inductor clearly followed the cyclical pattern of the gas exhausting from the engine. The maximum of the positive and negative excursion of the voltage, which was dependent on the warm-up time prior to the reading, was between about 0.5 and 0.8 volt. The total test time was about 3 minutes, and there was no visible sign of heat damage to the thermoelectric semiconductor material.

Concerning the semiconductor material, it is noteworthy that bismuth telluride has a melting point of 573 degrees centigrade. In light of the substantial temperatures in the exhaust of the engine, estimated to be in the range of 1,000 degrees centigrade, and giving consideration to the placement of the thermoelectric generator with respect to the engine, it is evident that the melting point of the semiconductor material was cyclically substantially exceeded in such material during the test. This, of course, occurred with no sign of melting. From the apparatus used, and the nature of the test, it can be concluded that temperatures in the semiconductor material cyclically exceeded the melting point of the material multiplied by 1.5. More generally, it is expected that, depending on the cycle employed, the thermoelectric material, and the form which the material takes, that cyclical heating in the thermoelectric material to, e.g., in the range of the melting point of the material multiplied by 10 could be employed without concern over any substantial melting of the material.

The reciprocating thermoelectric generator 30 of FIG. 17 and the solar thermoelectric generator 34 of FIGS. 18 and 19 illustrate the wide variety of ways in which cyclical operation of a thermoelectric generator can be provided.

Referring first to the reciprocating thermoelectric generator 30, it is electrically connected to transformer output apparatus 231. The generator 30 has one leg 232 of one type, Type A, thermoelectric material, and a second leg 234 of a second, compatible type, Type B, of thermoelectric material. The generator has four cold metallic contacts—with reference to the view of FIG. 17, a left, Type A leg contact 236, a right, Type A leg contact 240, a left, Type B leg contact 242 and a right, Type B leg contact 244. There are also two hot metallic connector contacts—a left connector contact 246 and a right connector contact 248. As is represented by the arrows 250, the legs 232 and 234 of the generator 30 reciprocate between two end positions. In the end position shown in FIG. 17, the left ends of the legs are in intimate contact with the hot left connector contact 246 and each of the right ends of the legs is in intimite contact with its respective cold right contact 240 or 244. In this configuration, thermoelectric power which is generated as a result of the temperature differences along the legs passes through a right primary inductor 252 of the transformer output apparatus 231. On the other hand, when the legs have reciprocated to their end position at the right, the right ends of the legs are in intimite contact with the hot right connector contact 248 and each of the left ends of the legs is in intimite contact with its respective cold left contact 236 or 242. In this configuration, thermoelectric power resulting from the temperature differences along the legs is provided to a left primary inductor 254 electrically connected between the left cold contacts. A transformer core 256 and a secondary inductor 260 for the core are present to, in conventional fashion, provide power generated by the generator 30 at the output terminals 262 of the transformer apparatus 231. (No load is shown across these output terminals.)

The legs of the reciprocating thermoelectric generator 30, as indicated, are designed to move to their end position at the right, remain there for a time interval, move to their end position at the left, remain there for a time interval, and then return to their end position at the right, etc., in repetitive, cyclical fashion. This will provide a cyclical, time-varying output voltage across each of the primary inductors, and a resulting cyclical, time-varying voltage across the secondary inductor 260. The timing, of course, can be varied in accordance with the capabilities of the particular generator 30 and transformer apparatus 231, as well as with the requirements of the load. In the generator of FIG. 17, it is noteworthy that each end of each leg acts both as a hot end and as a cold end, depending upon the stage of the cycle. With respect to the polarity relationship between the voltage across each primary and the secondary inductor, each primary inductor, of course, can have a choice of two such relationships. Further, in each case, this can be reversed from one polarity relationship to the other by reversing the orientation of the primary about the core in conventional fashion.

The apparatus (not shown) to maintain the hot contacts hot and the cold contacts cold can be such that the heat provided through the hot contacts and removed through the cold contacts is insubstantial relative to the capability of the apparatus to provide and remove heat. In such case, the hot contacts 246 and 248, with reference to the legs 232 and 234 of the generator 30, act substantially as "stiff" sources of heat for the legs—i.e., sources having temperatures which are substantially unaffected by the legs. Similarly, the cold contacts act substantially as "stiff" heat sinks for the legs—i.e., heat sinks having temperatures which are substantially unaffected by the legs. Such stiff sources and sinks are by way of contrast to "degradable" sources and sinks which would have temperatures which would be substantially changed by their interactions with the legs.

The solar thermoelectric generator 34 of FIGS. 18 and 19 also operates in cyclical fashion due to the cyclical blocking and unblocking of solar radiation from a hot metallic connector contact 264 which is bonded to the hot ends of two legs of compatible types of thermoelectric material. Two cold metallic contacts 266, each bonded to a cold end of a leg, have a load 268 connected between them. A rotatably mounted disk 270, driven by a motor 272, has two circumferential openings 274, to cyclically permit focused solar radiation, represented by the arrows 275, to impinge upon the hot connector contact and prevent such radiation from impinging upon the contact. In this fashion, the hot ends of the legs cyclically increase and decrease in temperature, with corresponding cyclically varying temperatures along the legs, to provide a cyclically increasing then decreasing generator output signal to the load 268. The shape and number of the circumferential openings, as well as the speed of rotation of the disk 270, can be varied in accordance with the particular requirements.

The focusing system 176 is represented as a Cassegrainian optical configuration, though a variety of other conventional focusing arrangements could be employed. The Cassegrainian system shown, in conventional fashion, has two primary reflectors 280 and one secondary reflector 282. Typically, each of the primary reflectors will have a paraboloidal shape in two dimensions, and the secondary reflector will have a hyperboloidal shape in two dimensions. Also, typically, the whole system, the optical system 276 as well as the generator 34 and various associated components, would be mounted to track the sun 284 during the day—in order to substantially maintain the ideal alignment of the system with respect to the sun.

With reference to the reciprocating thermoelectric generator 30 and the solar thermoelectric generator 34, along lines comparable to those previously discussed in a different context, these generators can be operated in a fashion such that temperatures in the thermoelectric material of the generator cyclically rise to substantially greater than the melting temperature of the material—e.g., to greater than such melting temperature multiplied by 1.5—without melting the material. Along lines previously described, it is estimated that typical temperatures of the order of such melting temperature multiplied by 10 can cyclically be provided without such melting, depending upon the material and the detailed manner of operation of the generator.

Turning now to the stack configuration generator 36, and initially referring to FIGS. 7, 8A and 8B, the stack configuration generator has four thermopiles which are connected in series to, in effect, form a single four-stack thermopile. With refernce to the view of FIG. 8A, there is a left, front 286, a left, rear 288, a right, front 290 and a right, rear 292 thermopile. Referring to FIGS. 8A and 8B, a left, bar connector 294 electrically connects the two left thermopiles along the top surfaces thereof, and a right bar connector 296 similarly electrically connects the right thermopiles along the top surfaces thereof. A center plate connector 300 electrically connects the left, rear thermopile 288 to the right rear thermopile 292 along the bottom surfaces thereof, to complete the series connection of the four thermopiles. A left plate connector 302, which is electrically connected to the bottom surface of the left, front thermopile 286, provides one output contact for the four-stack thermopile. A right plate connector 304, which is electrically connected to the bottom surface of the right, front thermopile 290, provides the second output contact. In the particular embodiment of FIGS. 7, 8A and 8B, a loop connector 306 is connected between the two output contacts, to provide with the four-stack thermopile, a path of a single electrical loop about a core (with a coating of material providing good electrical insulation along the core's external surfaces) 308 for the transformer output apparatus 40. Thus, in a fashion similar to the embodiments of FIGS. 1-3 and 4-6, there is a single loop primary inductor for the core. Also, there is a multi-loop secondary inductor 309 (having inner and outer wrapping sheets) wrapped about the core. By way of example, the secondary inductor might typically have 50 or 100 loops.

A housing 310 for the four-stack thermopile includes a left 312, a right 314, a top 316, a bottom 320 and a center 321 housing plate. To provide additional support, the housing also includes a left, front 322, a left, center 324, a left, rear 326, a right, front 328, a right, center 330 and a right, rear 322 housing post. Screws 334 having fingerholds for turning are employed to join plates of the housing, and plates and posts of the housing, in conventional fashion in order to hold the housing together. Where avoidance of an electrical connection between parts through such a screw is desirable, screws of an insulator material, such as nylon, and/or oversized holes, in some parts, for such screws, can be employed. With respect to the housing, it is noteworthy that the center housing plate 321 separates the left thermopiles 286 and 288 from the right thermopiles 290 and 292. The housing plates and posts are conveniently made of cold rolled steel.

Sheets of mica are employed to provide electrical insulation between various parts of the stack configuration generator 36 or, where intervening space provides such insulation, to act as a back-up for such insulation. Thus, there are center post sheets 340 bonded to the front and rear surfaces of each of the center housing posts 322 and 330; front post sheets 342 bonded to the rear surfaces of the left and right front housing posts 322 and 328; rear post sheets 344 bonded to the front surfaces of the left and right rear housing posts 326 and 332; bar connector sheets 346 over the top surfaces of the bar connectors 294 and 296; and post-bar connector sheets 348 between the top surfaces of the center posts and the bottom surfaces of the bar connectors. In addition, there is an oversheet of mica 350 on the upper surface of the bottom housing plate 320 to electrically insulate that plate from various components (FIG. 7), and center side sheets 352 bonded to the left and right surfaces of the center housing plate 321 to insure that insulation exists between such surfaces and the thermopiles. There is also a center strip sheet 354 over the upper surface of the center plate connector 300, between such connector and the center housing plate 321.

From the above, it should be evident that insulating sheets of mica are generally employed wherever it is desirable or necessary; and in thermoelectric generator embodiments along the lines of that of FIG. 7, mica sheets, generally, can conveniently be employed in this fashion.

Now turning to the details of the left, front 286, left, rear 288, right, front 290 and right, rear 292 thermopiles, which all employ the same form of components and of construction, reference, by way of example, will be made to the right, front thermopile 290.

This right, front thermopile 290 has a bottom heat conducting fin 356 and a bottom layer 360 of thermoelectric material of one type—Type A. It has a top heat conducting fin 362 and a top layer 364 of thermoelectric material of a second type—Type B—which is compatible with the material of the first type. In addition, the thermopile has a large number of intermediate layers 366 of thermoelectric material of the first type and a large number of intermediate layers 368 of thermoelectric material of the second type. Each intermediate layer 366 or 368 has an intermediate heat conduction fin disposed between it and each adjacent layer. Thus, the layers of thermoelectric material are stacked in a sandwich arrangement between heat conduction fins. (The vertical dashed lines, of course, represent a continuation of the sandwich arrangement.)

The fins have two configurations. A large number 370 of the fins, including a large number of intermediate fins, extend perpendicularly to the direction of stacking of the layers of thermoelectric material, to the hot side of the thermopile, so that they can conduct heat from a hot stream of gas, represented by one (on the right) of two arrows 372, toward the layers of thermoelectric material. On the other hand, the other heat fins 374, having the second configuration, also extend perpendicularly to the direction of stacking of the layers, but in this case, they extend to the cool side of the thermopile so that they can conduct heat away from the layers of thermoelectric material.

It, thus, is evident that, in the thermopile, there are a series of thermoelectric material layer positions up through the thermopile, and the layers of one type of material and of the other type of material alternate in these positions. It, further, is evident that there are also a series of fin positions up through the thermopile and that the fins having the configuration for conducting heat toward the thermoelectric materials and the fins having the configuration for conducting heat away from the thermoelectric material layers, similarly, appear in alternating fin positions.

Still referring, by way of specific example, to the right, front thermopile 290, the thermoelectric material layers and fins which are stacked to form the thermopile are bonded together along the full layer-fin surfaces which overlap one another. It is desirable to attempt to minimize the electrical resistivity through the stack which results from such bonding; therefore, techniques such as surface welding, electroplating and heat clading are desirable. Also, it is of particular interest that the configuration of the thermopile is particularly designed to create successive hot and cold junction areas up through the thermopile, to create successive additive voltage differences up through the thermopile.

The configuration is also designed to provide straight, linear paths, up through the thermopile, which the electrical current generated in the thermopile can travel. Thus, the fins as well as any material to bond them to the layers are electrical conductors and not electrical insulators. The referred to straight, linear electrical paths provided are represented by the electrical path arrows 376 shown in FIG. 8A. Essentially, there are an infinite number of such paths which together provide an electrical path having the same rectangular cross-section as the thermoalectric material layers. The providing of these electrical paths in this fashion is considered to be significant with reference to the reduction of electrical power loss due to resistance along the path of the thermopile electric current. In addition, the fact that the heat conduction fins, where they extend between the thermoelectric material layers, provide an electrical connection across the full extent of the cross-sectional area between the layers, is advantageous with respect to minimizing the electrical resistance. Providing such an electrical connection across a substantial part of such cross-sectional area—such as a majority of such area—is considered to be extremely desirable.

It, of course, is evident that the stack configuration thermoelectric generator 36 is particularly adapted to be driven by a hot fluid, such as the exhaust from an internal combustion engine. Thus, such exhaust, typically, is directed, as shown by the hot gas arrows 372, along the hot sides of the thermopiles 286, 288, 290 and 292. Cooling, at the cool sides of the thermopiles, may be to the ambient surroundings. Alternatively, a cold gas can be directly along such cool sides of the thermopiles to increase the cooling capability at such sides. For example, cold air, among other apparent choices, can readily be used. Further, the stack configuration thermoelectric generator 36 can readily be employed according to the cyclical method of operation wherein heat is cyclically provided to the thermoelectric material of the generator to cause cyclically increasing then decreasing temperatures in such thermoelectric material and a cyclically increasing then decreasing inductor voltage for the loop through the thermopile and loop connector 306. By way of example, such can be provided by mounting the generator to be driven, near an internal combustion engine having a flow rate characteristic along the lines illustrated in FIG. 12, at the position where the muffler would normally be mounted.

On the other hand, the stack configuration thermoelectric generator 26 is also particularly well adapted to be driven by a constant source of heated gas, as in FIG. 16. In this case, of course, as shown in FIG. 16, the transformer output apparatus 40 would be omitted, and the electrical load 44 to be driven by the generator would be connected across the left plate connector 302 and right plate connector 304.

As already pointed out, such a constant source of heated gas, with reference to the thermoelectric generator 48 shown in FIG. 16, provides a substantially constant flow rate of heated gas at a substantially constant temperature. As also was already indicated, this can be provided by an internal combustion engine mounted a distance from the generator such that the cyclical flow rate, by the time it reaches the generator, is a substantially constant flow rate at a substantially constant temperature—i.e., the cyclical variations substantially are averaged out. Further, as, for example, one changes the internal combustion engine from a one-cylinder engine having a flow rate characteristic along the lines illustrated in FIG. 12, to an eight-cylinder engine, the degree of cyclical variation, even where the engine is mounted close to the generator, necessarily decreases.

Before turning to materials and other associated aspects of the stack configuration thermoelectric generator 36, it will be useful to consider some basic matters relating to thermoelectric cells. For ease of understanding and discussion, it will be useful to refer to the typical thermoelectric cell of FIG. 15A connected to a load, as in FIG. 15A. Then, for the same reasons, it will be convenient to assume that an effective, average Seebeck Coefficient ($\overline{S}$) can be defined for the thermoelectric material of the cell of FIG. 15A as a whole. This would take account of expected minor variations which would occur with temperature (i.e., thus making the true Seebeck Coefficient for material of a leg of the cell dependent upon the position along the material) and of the interaction of the true Seebeck Coefficients of the two materials (i.e., what such coefficients are and whether they add (e.g., P- and N-type semiconductors) or subtract (e.g., metallic materials)). Defining such an effective, average Seebeck Coefficient is eminently reasonable for a variety of typical situations.

Then, along the lines indicated in FIG. 15A, it will be assumed that the cross-sectional area (A) through each of the two thermoelectric material legs of the cell is the same and is uniform along the leg. It, further, will be assumed that the hot contact 140 and cold contacts 141 and 142 are such good conductors and their bonds to the thermoelectric material legs are so good that the electrical resistance due to such contacts and to such bonds is insignificant as compared to the electrical resistance due to the thermoelectric material legs. Thus, with respect to this latter assumption, the total electrical resistance through the thermoelectric cell is assumed to be due solely to the resistance of the legs. Along related lines, to maximize power output to the load 143, it is assumed that the resistance of the load is matched with (equal to) the resistance of the thermoelectric cell.

With these assumptions, the equation for the power provided to the load (P(L)) in the typical thermoelectric cell unit of FIG. 15A is the following:

$$P(L)(\text{watts}) = (\tfrac{1}{4})(A/p l)(\overline{S}\Delta T)^2,$$

where
$\overline{S}$ = effective, average Seebeck Coefficient (volts/degree C.)
$p = (p1l1 + p2l2)/(l1 + l2)$ = equivalent resistivity of cell (ohn-cm)
$p1, p2$ = respective leg resistivities (ohm-cm)
$l1, l2$ = respective leg lengths (cm)
$A$ = uniform cross-section area of the legs (cm$^2$)
$T(H)$ = temperature at hot ends of legs (degrees C.)
$T(C)$ = temperature at cold ends of legs (degrees C.)
$\Delta T = T(H) - T(C)$ (degrees C.)

Now with respect to the above, as one extreme, it might be assumed that the hot contact 140 of FIG. 15A, with respect to the legs of thermoelectric material, acts as a totally "stiff" source of heat for the material. Thus, it can maintain the hot ends of the legs at its own temperature independently of any characteristics of the legs. Its temperature would then be T(H), which temperature completely determines the temperature at the hot ends of the legs. Corresponding to this, it might, in addition, then be assumed that the heat sink capabilities of the cold contacts 141 and 142 in FIG. 15A are so great that such cold contacts can maintain the cold ends of the thermoelectric material legs at T(C) independently of any characteristics of the legs themselves. Thus, the cold contacts act as totally "stiff" heat sinks. Under these extreme circumstances, which are herein employed for purposes of illustration and understanding, it is apparent from the equation for P(L) that, with reference to the choice of thermoelectric materials, the search is for compatible materials which have low electrical resistivities, can withstand high temperatures and will provide a high $\overline{S}$. However, the thermal conductivities of the leg materials have become essentially irrelevant.

On the other hand, in the common situation which is traditionally addressed, as is indicated in The Background of the Invention, the choice of materials for the legs will generally also include a desire for materials with low thermal conductivities, and such low thermal conductivities are typically accompanied by undesirable, high electrical resistivities (low electrical conductivities).

With this background, the materials and associated aspects of the stack configuration thermoelectric generator 36 of FIG. 7 can more readily be appreciated.

Figure 11:
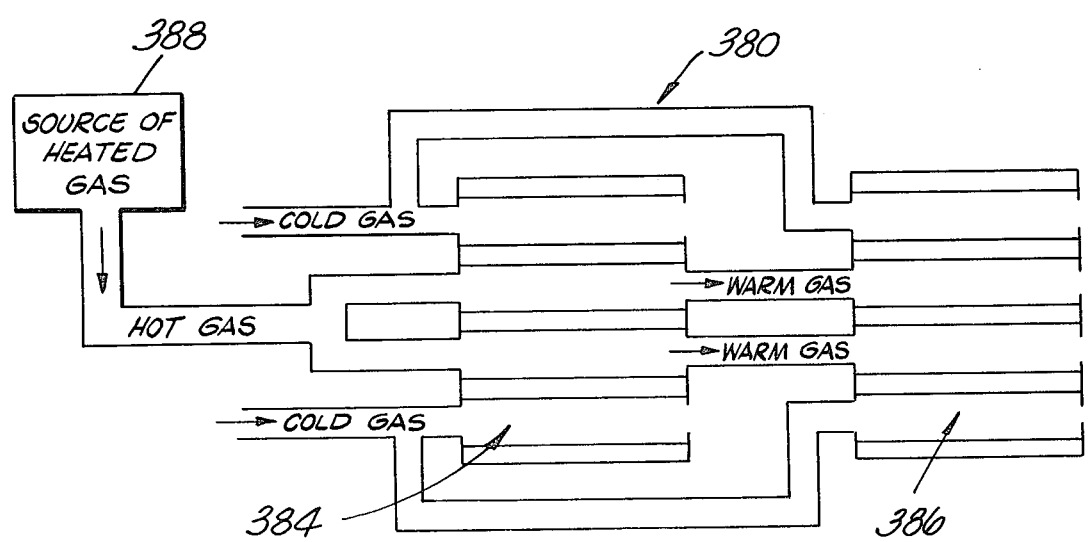
FIG. 11 is another diagrammatic view showing two thermoelectric generators of the type shown in FIG. 7 being driven.

In particular, the most beneficial use of the stack configuration thermoelectric generator 36 of FIG. 7 should typically be such a use in which the former situation and assumptions are more closely applicable than the common situation. This is so because the heat source for the generator, such as the exhaust from an internal combustion engine, would typically be expected to tend toward the above situation associated with a "stiff" source. This is also so as a result of the ready capability of generators such as the generator 36 to be configured in series, from a fluid flow standpoint, in order to utilize, downstream, heat energy which, as a result of the thermal conductivity of the thermoelectric materials, is not utilized to produce electrical energy upstream. This is represented in FIGS. 10 and 11 which will be discussed in more detail below.

The above considerations, along with the fact that metallic materials can generally withstand higher temperatures and harsher environments, and are generally less expensive, than semiconductors, generally point one toward metallic materials, as opposed to materials such as semiconductors, for the stack configuration generator 36. Stated more succinctly, the advantages of metallic materials will generally outweigh the typically higher Seebeck Coefficients and lower thermal conductivities of semiconductor materials. This is particularly the case where there is essentially a constant source of hot gas. However, even where there is essentially a cyclical source of hot gas, and a resulting cyclical mode of operation of the thermoelectric generator, the same general reasons should also often point toward metallic materials rather than semiconductor materials.

Thus, although thermoelectric semiconductor materials, such P-type bismuth telluride and N-type bismuth telluride materials, for the Type A and Type B layers of the stack configuration thermoelectric generator 36, may in certain circumstances be considered desirable, materials such as metallic alloys and elemental metals more often will be desirable. Typical exemplary choices for the two thermoelectric materials in the stack configuration generator, thus, are: an alloy having nickel and chromium as its primary constituents, such as Chromel, and an alloy having copper and nickel as its primary constituents, such Constantan; an alloy such as Chromel and an alloy having nickel and manganese as its primary constituents, such as Alumel; iron and an alloy such as Constantan; and copper and an alloy such as Constantan.

Continuing to refer by way of example to the right, front thermopile 290 in FIG. 8A, in order to attempt to minimize the electrical resistance up through the thermopile stack, it is desirable to provide a large cross-sectional area through the thermoelectric material layers for the thermopile current and a relatively short path through the thermoelectric material layers for such current. This geometry, of course, by tending to reduce the electrical resistance, tends to decrease the resistively dissipated electrical power in the thermopile. It is also desirable to provide a relatively large number of thermoelectric material layers since the total thermoelectric voltage across the thermopile increases with the number of thermoelectric material layer pairs.

In accordance with this, typical lengths and widths for the thermoelectric material layers are, respectively, 2.00 inches (5.08 cm) and 0.5 inch (1.3 cm). Concerning layer thicknesses, typical choices with associated typical numbers of layers of each type (for the right front thermopile 290) are: 0.010 inch (0.254 mm) and 130 layers; 0.040 inch (1.02 mm) and 52 layers; and 0.0625 inch (1.59 mm) and 36 layers. Such typical dimensions and numbers, of course, can be conventionally varied according to the particular requirements of a given situation. For ease of assembly of the layers and associated fins, each layer and fin has a pair of holes which are aligned with the pair of the next component up through the stack during the assembly process. These holes are apparent in, e.g., the top fin of the right, front thermopile in FIG. 8A.

Still referring, by way of example, to the right front thermopile 290, the heat conduction fins will desirably be of a material having high thermal as well as electrical conductivity. In addition, they will desirably have a relatively small thickness to minimize the electrical resistivity encountered by the thermopile current in passing through such thickness. With metallic alloys and elemental metals for the thermoelectric material layers, heavy duty copper is preferable. Typical dimensions are: length—2.00 inches (5.08 cm); width—2.00 inches (5.08 cm); and thickness—0.010 inch (0.254 mm). To address possible problems of corrosion due to the environment of the fins, chromium or nickel plating of the copper fins can be employed. Fins of, for example, stainless steel, have favorble corrosion resistance characteristics; however, their thermal conductivity suffers by comparison with copper. In addition, in the case of stainless steel, structural considerations such as rigidity may require an undesirable increase in the thickness of the fins. A similar situation to that of stainless steel obtains with respect to various of the super alloys, such as alloys sold under the names Hastelloy, Inconel and Renyl. A related important consideration with respect to the thermopile 290 is to attempt to provide a relatively large amount of electrical power per volume of thermoelectric and fin material. In particular, a power level of about 0.001 kilowatt/$cm^3$ is a typical acceptable level.

Now briefly turning to the left, front thermopile 286, left, rear thermopile 288 and right, rear thermopile 292, as was previously noted and as is apparent from FIG. 8A, such thermopiles have the same form and construction as the right, front thermopile 290. In particular, the left, rear thermopile 288 is identical to the right, front thermopile 290 in all respects. The left, front thermopile 286, on the other hand, is identical to the right, front thermopile except for reverse thermoelectric material layer positions between the two thermopiles for the Type A and Type B thermoelectric materials. The right, rear thermopile 292 then is identical to the left, front thermopile 290 in all respects. The reversal of thermoelectric material layer positions among the thermopiles of course is due to the requirements of the series connections of the thermopiles.

With regard to the left bar connector 294, right bar connector 296 and center plate connector 300, to provide high electrical conductivity, they can typically be made of heavy duty copper. This also applies to the left plate connector 302 and to the right plate connector 304, and of course, to the loop connector 306 of the transformer output apparatus 40. Each of the bar and plate connectors can be bonded to its respective opposing fin or fins by techniques such as surface welding, electroplating or heat cladding. Of course, in some cases in which copper has been indicated to be typical for components, other choices such as nickel plated or chromium plated copper may be required, for example, where poisoning of thermoelectric material layers which are semiconductors is a concern.

With respect to the insulated transformer core 308 and the secondary, output inductor 309, design concerns, including choices of materials, described in detail with respect to the embodiments of FIGS. 1-3 and FIGS. 4-6, also apply here.

Concerning another matter, in the embodiment of FIGS. 7, 8A and 8B, no thermal insulation is provided along the side surfaces of the thermoelectric material layers. With respect to such side surfaces, there of course is one per layer facing toward a generally hot area and one per layer facing toward a generally cool area. However, it is not desired to create a hot to cold gradient between the sides, but, as has been explained previously, to create a hot to cold or cold to hot (depending on the layer) gradient generally upwardly through the layer. Because of the high thermal conductivity of the heat conduction fins, and because the hot gas flow, and, if used, a cold gas flow, can generally be directed along areas of the fins away from the thermoelectric material layers, such thermal insulation, as indicated, is not provided. However, thermopiles along the lines of those shown in FIG. 8A can be readily provided with sheets of thermal insulation material bonded to and coextensive with the side surfaces of the thermoelectric material layers which face to a generally hot and a generally cold area, all in conventional fashion, if desired.

The use of a stack configuration thermoelectric generator such as the generator 36 of FIGS. 7, 8A and 8B, in a constant source thermoelectric generator system such as the system 42 of in FIG. 16, has already been noted. Similarly, and as already somewhat suggested, a stack configuration thermoelectric generator such as the generator 36 of these figures, may also be employed in the integrated, cyclical thermoelectric generator system of FIG. 9. Thus, the stack configuration generator 36 can be employed as the thermoelectric generator 22 of this system, and the transformer output apparatus 40 of FIG. 7 can be employed as the thermoelectric generator interface 24 of this system.

FIGS. 10 and 11 illustrate how a number of thermoelectric generators, each of which is the same as the generator 36 of FIGS. 7, 8A and 8B, may be serially connected in fluid communication with one another. Thus, in FIG. 11, a hot to warm serial system 380 is shown, and in FIG. 10, a cold to warm serial system 382 is shown.

Referring first to the hot to warm serial system 380, there is an upstream stack configuration thermoelectric generator 384 and a downstream stack configuration thermoelectric generator 386 each of which is the same as the stack configuration generator 36 of FIGS. 7, 8A and 8B. The upstream generator is provided with gas from a source of heated gas 388 so that the gas flows along the fins which extend to the hot sides of the thermopiles of the generator. Similarly, cold gas from a conventional source of such gas (not shown) is provided to act as a heat sink gas along the fins of the thermopile that extent to the cool sides of the thermopiles. This gas, from the cold source of cold gas, is also directly provided along the fins extending to the cool sides of the thermopiles in the downstream generator 386. However, the hot gas from the source of heated gas 388, after it has passed through the upstream generator 384, still has sufficient heat to act as a heat source for the hot side fins of the downstream thermoelectric generator 386. Thus, it is provided to the downstream generator as its source of heat. This is to avoid the waste of heat energy—i.e., heat energy which otherwise would be wasted is converted to electrical energy by the downstream generator.

It should be evident that, so long as it is considered efficient, additional downstream generators can be serially added to directly receive cold gas from the cold gas source and to receive gas, as its heat source, from the generator immediately upstream thereof. It, also, is noteworthy that whether the source of heated gas 388 of FIG. 11 has characteristics and a configuration with respect to the generators 384 and 386 of FIG. 11, so as to act substantially as a constant heat source or a cyclical heat source has not been specified—as it can be either.

In the cold to warm serial system 384 of FIG. 10, again, an upstream generator 390 and a downstream generator 392 are each the same as the stack configuration generator 36 of FIGS. 7, 8A and 8B. In addition, a source of heated gas 394 and the fluid communication features between the source of heated gas and the upstream generator are the same as in FIG. 11. However, by way of contrast, in the cold to warm serial system, the cold gas which is provided along the fins to the cool sides of the thermopiles in the upstream generator, after being warmed by such fins, is directed along the fins to the hot sides of the downstream generator, to act as the heat source for such downstream generator. Again, it should be apparent that additional downstream generators, bearing the same relationship to their respective upstream generators, as the downstream generator 392 of FIG. 10 bears to the upstream generator 390 of FIG. 10, can be added, so long as such is considered efficient.

The way of removing electrical power generated by the generators of FIGS. 10 and 11 (such as transformer output apparatus along the lines of FIG. 7 for a cyclical situation) are not specified in FIGS. 10 and 11. However, in the case of cyclical operation, transformer output apparatus along the lines of that of FIG. 7 could be used for each generator. For constant operation, this, of course, can be conventionally accomplished.

It will be evident to those skilled in the art that many changes and modifications may be made in the methods and apparatus which have been described in detail without departing from the spirit or scope of the invention. Accordingly, the scope hereof shall be determined in accordance with the claims as set forth below.

What is claimed is:

1. A method of operating a thermoelectric generator for generating electrical power in response to heat, comprising the steps of:
   cyclically producing increasing then decreasing temperature differences in the thermoelectric material of the generator, including cyclically increasing the temperature of part of said thermoelectric material to at least a temperature exceeding the melting temperature of said material; and
   generating a cyclically increasing then decreasing electrical generator output signal, in response to said temperature differences, to transmit electrical power generated by the generator away from the generator.

2. The method of claim 1 wherein said temperature of said part of the thermoelectric material is cyclically increased to at least approximately the melting temperature of said material multiplied by 1.5.

3. The method of claim 1 wherein said cyclically increasing of the temperature is substantially without melting said material.

4. The method of claim 1 comprising the additional step of:
cyclically providing heat to the thermoelectric material of the generator.

5. The method of claim 4 comprising the additional step of producing said heat by combustion.

6. The method of claim 1 comprising the additional step of cyclically providing heat to said thermoelectric material of the generator by cyclical combustion in an internal combustion engine.

7. The method of claim 1 wherein said output signal comprises the inductor voltage for a loop about a magnetic core.

8. The method of claim 7 wherein the current through said loop passes through the thermoelectric material of the generator.

9. The method of claim 7 wherein the thermoelectric material of the generator forms part of said loop about said core.

10. A thermoelectric generator for generating electrical power in response to heat, comprising:
a thermopile to receive the heat and generate electrical power in response to the heat, including a plurality of layers of thermoelectric material of a first type and a plurality of layers of thermoelectrical material of a second type, said layers of said two types having alternating thermoelectric material layer positions in said thermopile, each of said layers of each said type and the next said layer of the other said type being electrically connected across at least approximately the majority of the area between said layers; and
electrical connector means for transmitting said generated electrical power away from said thermopile;
said thermopile further including a plurality of heat conduction fins each between two said thermoelectric material layers of said two types in said alternating thermoelectric material layer positions, to conduct electrical current between said layers and extending substantially perpendicularly to the direction of stacking of said layers to a position substantially away from said layers.

11. A thermoelectric generator as defined in claim 10 wherein said plurality of fins have two alternating fin configurations in said thermopile, a first configuration for receiving heat substantially distant from said two layers for said first configuration fin and conducting said heat between said layers in which said extending is to one side of said layers, and a second configuration for receiving heat between said two layers for said second configuration fin and conducting said heat substantially distant from said layers in which said extending is to the other side of said layers.

12. A thermoelectric generator for generating electrical power in response to heat, comprising:
a thermopile to receive the heat and generate electrical power in response to the heat, including a plurality of layers of thermoelectric material of a first type and a plurality of layers of thermoelectrical material of a second type, said layers of said two types having alternating thermoelectric material layer positions in said thermopile, each of said layers of each said type and the next said layer of the other said type being electrically connected to provide, with said plurality of layers of said two types, a substantially linear electrical path through and between said plurality of layers of said two types; and
electrical connector means for transmitting said generated electrical power away from said thermopile,
said thermopile further including a plurality of heat conduction fins each between two said thermoelectric material layers of said two types in said alternating thermoelectric material layer positions, to conduct electrical current between said layers and extending substantially perpendicularly to the direction of said electrical path to a position substantially away from said layers.

13. A thermoelectric generator as defined in claim 12 wherein said substantially linear electrical path is a substantially straight, linear electrical path.

14. A thermoelectric generator as defined in claim 12 wherein said plurality of fins have two alternating fin configurations in said thermopile, a first configuration for receiving heat substantially distant from said two layers for said first configuration fin and conducting said heat between said layers in which said extending is to one side of said layers, and a second configuration for receiving heat between said two layers for said second configuration fin and conducting said heat substantially distant from said layers in which said extending is to the other side of said layers.

15. A thermoelectric generator system, comprising:
a thermopile including a plurality of layers of thermoelectric material of a first type and a plurality of layers of thermoelectric material of a second type, said layers of said two types having alternating thermoelectric material layer positions in said thermopile, each of said layers of each said type and the next said layer of the other said type being electrically connected across at least approximately the majority of the area between said layers;
means for cyclically producing increasing then decreasing temperature differences in said layers to generate cyclically increasing then decreasing electrical power in said thermopile; and
electrical connector means for transmitting said generated electrical power away from said thermopile.

16. A thermoelectric generator system as defined in claim 15 wherein said means for cyclically producing increasing then decreasing temperature differences, includes means for cyclically increasing the temperature of part of said thermoelectric material of said layers to at least a temperature exceeding the melting temperature of said material.

17. A thermoelectric generator system as defined in claim 15 wherein said thermopile is stationary.

18. A thermoelectric generator system, comprising:
a thermopile including a plurality of layers of thermoelectric material of a first type and a plurality of layers of thermoelectric material of a second type, said layers of said two types having alternating thermoelectric material layer positions in said thermopile, each of said layers of each said type and the next said layer of the other said type being electrically connected to provide, with said plurality of layers of said two types, a substantially linear electrical path through and between said plurality of layers of said two types;
means for cyclically producing increasing then decreasing temperature differences in said layers to generate cyclically increasing then decreasing electrical power in said thermopile; and
electrical connector means for transmitting said generated electrical power away from said thermopile.

19. A thermoelectric generator system as defined in claim 18 wherein said means for cyclically producing increasing then decreasing temperature differences, includes means for cyclically increasing the temperature of part of said thermoelectric material of said layers to at least a temperature exceeding the melting temperature of said material.

20. A thermoelectric generator system as defined in claim 18 wherein said thermopile is stationary.

21. A thermoelectric generator system, comprising:
a thermopile for generating electrical current through said thermopile in response to heat;
a magnetic core; and
electrical connector means electrically connected to said thermopile for forming a closed electrical path of a single loop only through said thermopile about said core for said electrical current.

22. A thermoelectric generator system as defined in claim 21 wherein said magnetic core comprises a transformer core and said loop is the loop of a single loop primary, input inductor for said core, further comprising a secondary, output inductor for said core about said core.

23. A thermoelectric generator system, comprising:
a thermopile for generating electrical current through said thermopile in response to heat;
a transformer core having a secondary, output inductor about said core; and
electrical connector means electrically connected to said thermopile for forming a closed electrical path for said current including at least one loop of a primary, input inductor about said core.

24. A thermoelectric generator system, comprising:
a thermopile for generating electrical current through said thermopile in response to heat;
a magnetic core;
electrical connector means electrically connected to said thermopile for forming a closed electrical path of a single loop only through said thermopile about said core for said electrical current; and
means for cyclically producing increasing then decreasing temperature differences in the thermoelectric material of said thermopile to generate a cyclically increasing then decreasing inductor voltage for said loop.

25. A thermoelectric generator system, comprising:
a thermopile for generating electrical current through said thermopile in response to heat;
a transformer core having a secondary, output inductor about said core;
electrical connector means electrically connected to said thermopile for forming a closed electrical path for said current including at least one loop of a primary, input inductor about said core; and
means for cyclically producing increasing then decreasing temperature differences in the thermoelectric material of said thermopile to generate a cyclically increasing then decreasing inductor voltage for said loop.

* * * * *